(12) United States Patent
Aoki et al.

(10) Patent No.: US 9,153,495 B2
(45) Date of Patent: Oct. 6, 2015

(54) SEMICONDUCTOR DEVICE AND METHOD OF MANUFACTURING THE SAME

(71) Applicant: Hitachi, Ltd., Tokyo (JP)

(72) Inventors: Mayu Aoki, Kokubunji (JP); Kenichi Takeda, Higashimurayama (JP); Kazuyuki Hozawa, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/638,052

(22) Filed: Mar. 4, 2015

(65) Prior Publication Data

US 2015/0187651 A1 Jul. 2, 2015

Related U.S. Application Data

(63) Continuation of application No. 13/837,212, filed on Mar. 15, 2013.

(30) Foreign Application Priority Data

Apr. 25, 2012 (JP) .................................. 2012-99405

(51) Int. Cl.
H01L 21/30 (2006.01)
H01L 21/46 (2006.01)
H01L 21/82 (2006.01)
H01L 21/52 (2006.01)

(52) U.S. Cl.
CPC ................ H01L 21/82 (2013.01); H01L 21/52 (2013.01)

(58) Field of Classification Search
USPC ........... 438/455; 257/635, E23.167, E25.021, 257/E27.111
See application file for complete search history.

(56) References Cited

U.S. PATENT DOCUMENTS

| | | |
|---|---|---|
| 2007/0207592 A1 | 9/2007 | Lu et al. |
| 2008/0267556 A1 | 10/2008 | Dangler et al. |
| 2009/0134401 A1 | 5/2009 | Maekawa |
| 2009/0173530 A1 | 7/2009 | Sakamoto et al. |
| 2011/0168434 A1 | 7/2011 | Farooq et al. |
| 2011/0248396 A1 | 10/2011 | Liu et al. |
| 2011/0265324 A1 | 11/2011 | Sakamoto et al. |
| 2013/0171773 A1 | 7/2013 | Farooq et al. |

FOREIGN PATENT DOCUMENTS

JP 07-014982 A 1/1995

*Primary Examiner* — Telly Green
(74) *Attorney, Agent, or Firm* — Miles & Stockbridge PC

(57) ABSTRACT

A method of manufacturing a semiconductor device includes: a step of forming an inorganic insulating film and an organic insulating film on one surface of a first substrate; a step of forming an opening portion by dry-etching a laminated film of them; a step of forming a bump electrode inside the opening portion; and a step (bonding step) of bonding the one surface of the first substrate having a bump electrode formed thereon and one surface of a second substrate having a bump electrode formed thereon to each other. A surface treatment on the inorganic insulating film is performed subsequent to the step of forming the opening portion but prior to the bonding step. By performing the surface treatment on the organic insulating film, connecting property between the substrates can be improved.

6 Claims, 31 Drawing Sheets

SEMICONDUCTOR DEVICE AND METHOD OF MANUFACTURING THE SAME

CROSS-REFERENCE TO RELATED APPLICATION

The present application claims priority from Japanese Patent Application No. 2012-099405 filed on Apr. 25, 2012, the content of which is hereby incorporated by reference into this application.

TECHNICAL FIELD OF THE INVENTION

The present invention relates to a semiconductor device and a method of manufacturing a semiconductor device. More particularly, the present invention relates to a technique effectively applied to a semiconductor device in which a plurality of semiconductor substrates are electrically connected with each other via electrodes.

BACKGROUND OF THE INVENTION

In recent years, as one of methods for miniaturizing a semiconductor device and for achieving high performances thereof, a packaging technique has been developed, in which semiconductor substrates each made of a single crystal silicon (hereinafter, referred to as silicon substrate) are laminated so that the silicon substrates are electrically connected to each other by using fine electrode wires.

As a recently-focused technique of the above-described packaging techniques, there is a method in which integrated circuits formed on a plurality of silicon substrates are electrically connected to each other by using fine electrodes each referred to as bump electrode which connects silicon substrates with each other or electrodes each referred to as silicon through electrode (Through Silicon Via) which penetrates through a silicon substrate.

In the case of a semiconductor device to which the above-described technique is adopted, the connection reliability of the bump electrodes which connect the silicon substrates with each other deteriorates due to a stress caused by heat and impacts applied to the silicon substrates. For this reason, a technique for ensuring the connection reliability of the bump electrodes in which the bump electrodes are protected by sealing the periphery of the bump electrodes with an insulator such as a resin is essential.

One of methods for sealing the periphery of the bump electrodes with the resin is a pre-coating method. This is a method for electrically connecting the bump electrodes with each other by, prior to a step for bonding two silicon substrates (for example, silicon wafers) having bump electrodes formed thereon with each other, coating each silicon substrate with a thermosetting resin represented by an epoxy resin, and then, thermally compression-bonding the two silicon substrates with each other.

However, in the case of the above-described pre-coating system for connecting the bump electrodes with each other by coating the silicon substrates having the bump electrodes formed thereon with the resin, and then, thermally compression-bonding the silicon substrates with each other, the resin adhered onto a surface of the connection of the bump electrodes sometimes enter a space between the bump electrodes upon the thermal compression-bonding. This entering causes a high contact resistance between the bump electrodes, and besides, a non-contact state between the bump electrodes or others, which result in a problem of a reduction of the connection reliability of the bump electrodes.

Accordingly, in order to eliminate such a failure as the entering of the resin into the space of the surface of the connection between the bump electrodes, some methods in which flattened bump electrodes and a resin are simultaneously joined with each other so as to simultaneously perform connection of the bump electrodes with each other and connection of the resins with each other have been proposed.

For example, the following Patent Document 1 (Specification of U.S. Patent Application Laid-Open Publication No. 2007/0207592) discloses a method of forming a resin portion having an opening portion in a silicon substrate having an LSI formed thereon, and then, burying a bump electrode material into the opening portion of the resin, performing polishing so that there is no step between the resin and an upper surface of the bump electrode to be flattened, similarly forming the bump electrode and the resin in another silicon substrate having an LSI formed thereon, and bonding the resins formed on the two silicon substrates with each other and the electrodes thereon with each other by thermal compression bonding.

Patent Document 2 (Japanese Patent Application Laid-Open Publication No. H07-014982) discloses the following step as a method for bonding two substrates with each other. First, a protective insulating film (12) on a quartz substrate (30) side is opened, metal films (65 and 66) mainly made of Al are buried in the opening portion, and they are flattened on the same level as a surface of the protective insulating film (12). Further, a thick polycrystalline Si film (24) is deposited on a semiconductor integrated circuit device formed on another single crystal Si substrate (11), and polishing a surface of the film to be flattened, and then, forming an adhesive layer (23) made of a fluorine-based resin on the surface thereof. Next, an opening portion reaching the semiconductor integrated circuit device is formed in the adhesive layer (23), and then, an insulting treatment is performed onto an opening portion side wall, metal films (67 and 68) mainly made of Al are buried into the opening portion and are flattened. Then, these substrates are bonded with each other (see FIGS. 25 and 26).

SUMMARY OF THE INVENTION

However, the technique described in the above-described Patent Document 1 includes a problem that gas is desorbed from the resin because heat is applied in the step of the connection between the silicon substrates, and is trapped in the surface of the connection between the resins to cause voids, which results in peeling of the silicon substrate by a subsequent dicing step.

Also, the technique described in the above-described Patent Document 2 includes a problem of a low heat resistance of the fluorine-based resin serving as the adhesive layer which is not suitable for the thermal compression-bonding between the substrates.

Accordingly, the present inventors have tried the connection of the silicon substrates with each other by using a resin having a higher heat resistance (which is a heat-resistant resin) than that of the fluorine-based resin. As a result, the peeling has occurred between the substrates in such a step as the dicing step or a back-grinding step.

A preferred aim of the present invention is to provide a technique capable of improving a property of the semiconductor device. More particularly, a preferred aim of the present invention is to form an electrode and a sealing resin with high productivity as solving the above-described problems included in the conventional techniques, and besides, exerting an effect for suppressing the voids upon the bonding so as to achieve the connection between the substrates with high reliability.

The above and other preferred aims and novel characteristics of the present invention will be apparent from the description of the specification of the present application and the accompanying drawings.

The typical ones of the inventions disclosed in the present application will be briefly described as follows.

A semiconductor device described in the typical embodiment of the inventions disclosed in the present application includes: a laminated insulating film having a first insulating film arranged on an upper portion of one surface of a first substrate and made of an inorganic film and a second insulating film arranged on the first insulating film and made of an organic film; and a first electrode arranged inside an opening portion opened by dry-etching the laminated insulating film, and the second insulating film is a heat-resistant insulating film.

A method of manufacturing a semiconductor device described in the typical embodiment of the inventions disclosed in the present application is a method of manufacturing a semiconductor device for laminating a first substrate having a first electrode formed on one surface thereof and a second substrate having a second electrode formed on one surface thereof, and bonding the one surface of the first electrode and the one surface of the second electrode with each other, so that the first electrode and the second electrode are electrically connected with each other. The method includes: (a) a step of forming a first insulating film made of an organic film on the one surface of the first substrate; (b) a step of forming a second insulating film made of an organic film on the first insulating film; (c) a step of forming an opening portion by dry-etching the first insulating film and the second insulating film; (d) a step of forming the first electrode by burying a conductive film inside the opening portion; and (e) a step of bonding the one surface of the first substrate and the one surface of the second substrate with each other, and includes a step of performing a surface treatment on the second insulating film subsequent to the above-described step of (c) but prior to the above-described step of (e).

According to the semiconductor device described in the following typical embodiment of the inventions disclosed in the present application, a property of the semiconductor device can be improved.

Also, according to the method of manufacturing a semiconductor device described in the following typical embodiment of the inventions disclosed in the present application, a semiconductor device having a good property can be manufactured. More particularly, by performing a surface treatment on an organic insulating film on the substrate surface subsequent to the step of forming the opening portion by the dry-etching but prior to the step of connecting the substrates with each other, the connectivity between the substrates can be improved so as to form a semiconductor device having high reliability.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, numerical values, amount, range, and others), the number of the elements is not limited to a specific number unless otherwise stated or except the case where the number is apparently limited to a specific number in principle. The number larger or smaller than the specified number is also applicable.

Further, in the embodiments described below, the components (including element steps) are not always indispensable unless otherwise stated or except the case where the components are apparently indispensable in principle. Similarly, in the embodiments described below, when the shape of the components, positional relation thereof, and others are described, the substantially approximate and similar shapes and others are included therein unless otherwise stated or except the case where it is conceivable that they are apparently excluded in principle. The same goes for the numerical value and others described above (including number of pieces, numerical values, amount, range, and others).

Hereinafter, embodiments of the present invention will be described in detail with reference to the accompanying drawings. Note that components having the same function are denoted by the same reference symbols throughout the drawings for describing the embodiment, and the repetitive description thereof will be omitted. Moreover, in the case where a plurality of similar members (portions) exist, individual or specific portions are sometimes indicated by adding codes to collective-term symbols. In addition, the description of the same or similar portions is not repeated in principle unless particularly required in the following embodiments.

Also, in some drawings used in the embodiments, hatching is omitted even in a cross-sectional view so as to make the drawings easy to see. Further, in cross-sectional views, a size of each portion does not correspond to that of the actual device, and a specific portion is sometimes illustrated relatively larger so as to easily understand the drawings.

First Embodiment

Explanation of Structure

Figure 1:
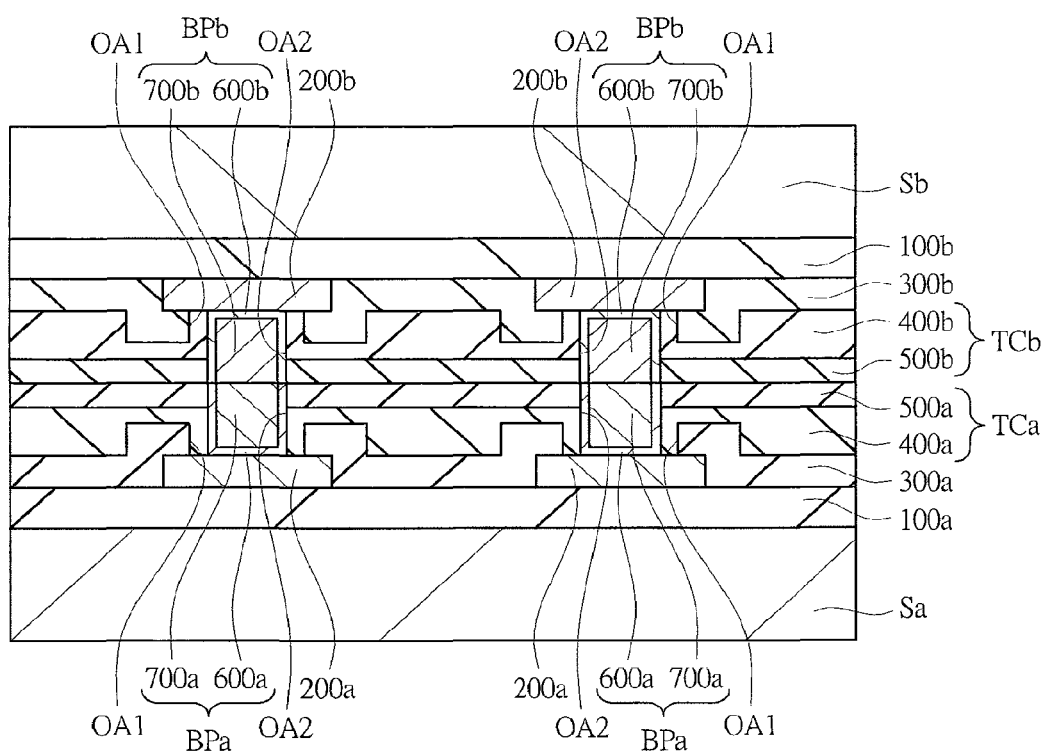
FIG. 1 is a cross-sectional view illustrating a semiconductor device of a first embodiment.

With reference to FIG. 1, a semiconductor device of the present embodiment will be explained. FIG. 1 is a cross-sectional view illustrating the semiconductor device of the present embodiment.

As illustrated in FIG. 1, the semiconductor device of the present embodiment has a laminated structure of a first substrate "Sa" and a second substrate "Sb".

The first substrate Sa is a semiconductor substrate made of silicon in which a semiconductor element (not illustrated) is arranged on a front surface thereof (a first surface, an element surface, a surface on a formation side of a bump electrode, a surface on a formation side of the semiconductor element). In FIG. 1, a formation layer for the semiconductor element (an inner layer of the semiconductor element) is denoted by a symbol 100a. On the formation layer 100a for the semiconductor element, a pad electrode (a pad region, a conductive film) 200a is arranged. This pad electrode 200a is a part of the uppermost layer wire, and becomes an externally-connecting portion. The uppermost layer wire is covered with an inorganic insulating film 300a, and the pad electrode 200a is exposed from an opening portion OA1 of the inorganic insulating film 300a.

Moreover, on the inorganic insulating film 300a, an inorganic insulating film (inorganic film) 400a is arranged. A surface of this inorganic insulating film 400a is flattened. Further, on the inorganic insulating film 400a, an organic insulating film (organic film) 500a is arranged. The organic insulating film 500a has photosensitivity.

Moreover, on a laminated insulating film TCa formed of the inorganic insulating film 400a and the organic insulating film 500a, an opening portion OA2 is formed, and a bump electrode BPa is arranged inside the opening portion OA2.

The opening portion OA2 is formed by dry-etching the laminated insulating film TCa of the inorganic insulating film 400a and the organic insulating film 500a. Moreover, the bump electrode BPa is formed by burying a conductive film (conductor film) therein. More specifically, it is formed by burying a barrier metal film 600a, a seed film (not illustrated), and a Cu (copper) film 700a therein. Also, a surface treatment is performed on the organic insulating film 500a which is the uppermost layer of the first substrate Sa.

The second substrate Sb also has the same structure as that of the first substrate Sa. The second substrate Sb is a semiconductor substrate made of silicon in which a semiconductor element (not illustrated) is arranged on a front surface thereof (a first surface, an element surface, a surface on a formation side of the bump electrode, a surface on a formation side of the semiconductor element). In FIG. 1, the formation layer for the semiconductor element (which is an inner layer of the semiconductor element) is denoted by 100b. Note that, in FIG. 1, the formation layer 100b for the semiconductor element is illustrated on the lower side of the second substrate Sb. On the formation layer 100b for the semiconductor element (on the lower side in FIG. 1), the pad electrode (conductive film) 200b is arranged. This pad electrode 200b is a part of the uppermost layer wire, and becomes an externally-connecting portion. The uppermost layer wire is covered with the inorganic insulating film 300b, and the pad electrode 200b is exposed from the opening portion OA1 of the inorganic insulating film 300b.

Moreover, on the inorganic insulating film 300b (on the lower side in FIG. 1), an inorganic insulating film (inorganic film) 400b is arranged. A surface of this inorganic insulating film 400b (on the lower side in FIG. 1) is flattened. Further, on the inorganic insulating film 400b (on the lower side in FIG. 1), an organic insulating film (organic film) 500b is arranged. The organic insulating film 500b has photosensitivity.

Moreover, on a laminated insulating film TCb formed of the inorganic insulating film 400b and the organic insulating film 500b, an opening portion OA2 is arranged, and a bump electrode BPb is arranged inside the opening portion OA2.

The opening portion OA2 is formed by dry-etching the laminated insulating film TCb of the inorganic insulating film 400b and the organic insulating film 500b. Moreover, the bump electrode BPb is formed by burying a conductive film (conductor film) therein. More specifically, it is formed by burying a barrier metal film 600b, a seed film (not illustrated), and a Cu (copper) film 700b therein. Also, a surface treatment is performed on the organic insulating film 500b which is the uppermost layer of the second substrate Sb.

The semiconductor device of the present embodiment has such a structure that the surface side of the first substrate Sa and the surface side of the second substrate Sb are bonded with each other so that the organic insulating films (500a and 500b) and the bump electrodes (BPa and BPb) are in contact with each other.

Although the elements to be formed on the formation layers (100a and 100b) for the semiconductor elements are not limited, for example, a MISFET can be arranged.

Figure 2:
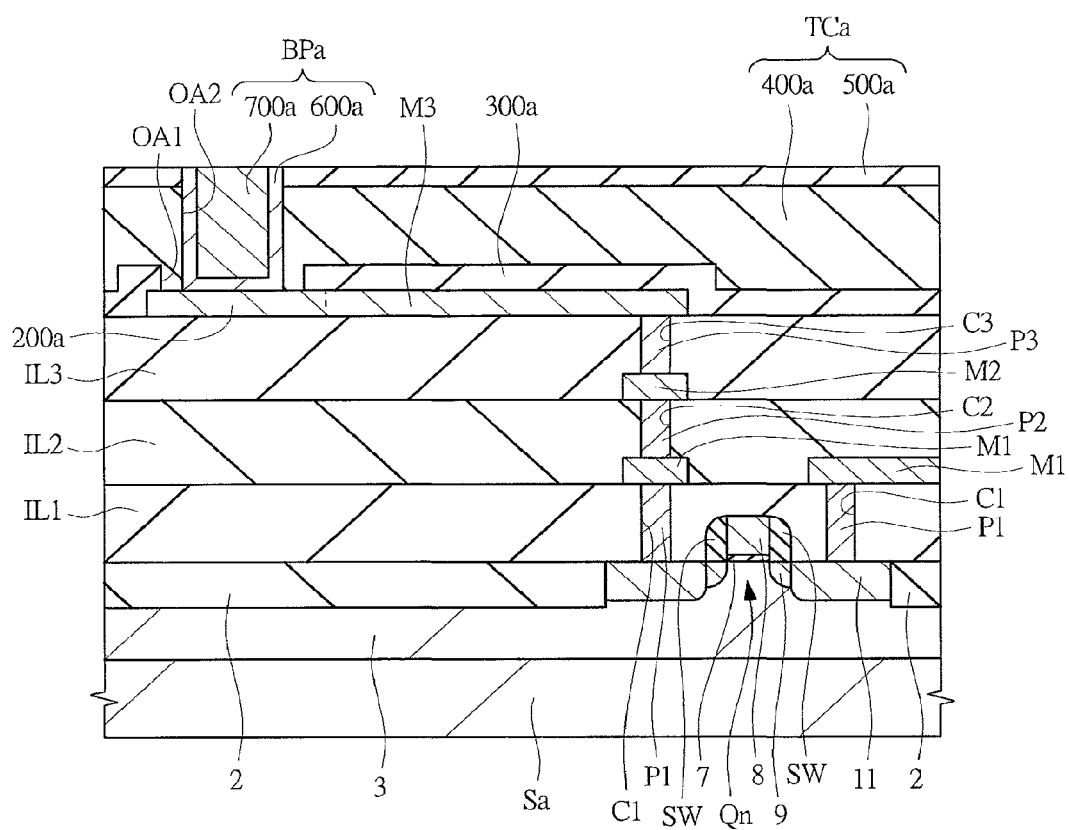
FIG. 2 is a cross-sectional view illustrating a structural example of a first substrate having an MISFET in a formation layer for a semiconductor element.

FIG. 2 is a cross-sectional view illustrating a structural example of the first substrate having the MISFET formed in the formation layer for the semiconductor element.

As illustrated in FIG. 2, on the surface of the first substrate Sa, a MISFET (Metal Insulator Semiconductor Field Effect Transistor: MIS-Type Field Effect Transistor) Qn is arranged. This MISFET is an n-channel type MISFET, and is formed on a surface of a p-type well region 3 surrounded by an element isolation region 2. The n-channel type MISFET (Qn) includes: a gate insulating film 7 arranged on the surface of the p-type well region 3; a gate electrode 8 arranged on the gate insulating film 7; and a source/drain semiconductor region (n-type impurity diffusion layer) arranged in the first substrate Sa (p-type well region 3) on both sides of the gate electrode 8. Moreover, a sidewall film SW made of an insulator is arranged on a side wall of the gate electrode 8.

The source/drain semiconductor region (n-type impurity diffusion layer) has so-called an LDD (Lightly Doped Drain) structure, which is composed of an n-type semiconductor region 9 and an $n^+$-type semiconductor region 11 that has an impurity concentration higher than that of the n-type semiconductor region 9. The $n^+$-type semiconductor region 11 is arranged on each of the p-type well regions 3 on both sides of the gate electrode 8 and the sidewall film SW, and the $n^-$-type semiconductor region 9 is arranged on each of the p-type well regions 3 on both sides of the gate electrode 8.

Above the MISFET (Qn), wires M1 to M3 are arranged. Plugs P1 to P3 connect among the respective wires (M1 to M3) and between the wire M1 and the MISFET (Qn). Symbols C1 to C3 denote contact holes.

More specifically, an interlayer insulating film IL1 is arranged on the MISFET (Qn), and the plug P1 is arranged inside the interlayer insulating film IL1. Moreover, on the interlayer insulating film IL1, the wire M1 is arranged. An interlayer insulating film IL2 is arranged on the wire M1, and the plug P2 is arranged inside the interlayer insulating film IL2. Further, on the interlayer insulating film IL2, the wire M2 is arranged. An interlayer insulating film IL3 is arranged on the wire M2, and the plug P3 is arranged in the interlayer insulating film IL3. On the interlayer insulating film IL3, the wire M3 is arranged. Here, the wire M3 is the uppermost layer wire, and partially forms the pad electrode 200a. The structure on the pad electrode 200a is the same as described above. These wires (M1 to M3) are formed by patterning a metal film (for example, aluminum (Al) film) deposited by a sputtering method. Here, the three-layered (M1 to M3) wire is exemplified. However, a multi-layered wire may be arranged.

Note that, in addition to the MISFET (Qn), other elements such as a p-channel type MISFET, a transistor having a different structure (bipolar transistor, LDMOS (Laterally Diffused MOS)), a capacitative element, or various types of memories may be formed. Moreover, as a circuit formed by the above-described MISFET (Qn) or others, a logic circuit, a memory circuit, or others is cited.

Moreover, the semiconductor element to be formed on the formation layer 100a for the semiconductor element in the first substrate Sa and the semiconductor element to be formed on the formation layer 100b for the semiconductor element in the second substrate S2 are not necessarily the same as each other, and, for example, the first substrate Sa may be laminated as a logic-use substrate, and the second substrate Sb may be laminated as a memory-use substrate. Moreover, the first substrate Sa and the second substrate Sb may be laminated as system substrates each on which a logic and a memory are embedded.

Moreover, on the first substrate Sa or the second substrate Sb, a MEMS (Micro Electro Mechanical Systems) may be formed. The MEMS is a device obtained by integrally forming an element such as a sensor or an actuator and an electronic circuit on a substrate. For example, the sensor may be formed on the first substrate Sa, and the electronic circuit may be formed on the second substrate Sb, and these substrates may be laminated.

[Explanation of Manufacturing Method]

Next, with reference to FIGS. 3 to 10, manufacturing steps of the semiconductor device of the present embodiment will be explained, and besides, the structure of the semiconductor device of the present embodiment will be further clarified. FIGS. 3 to 10 are cross-sectional views illustrating the manufacturing steps of the semiconductor device of the present embodiment.

Figure 3:
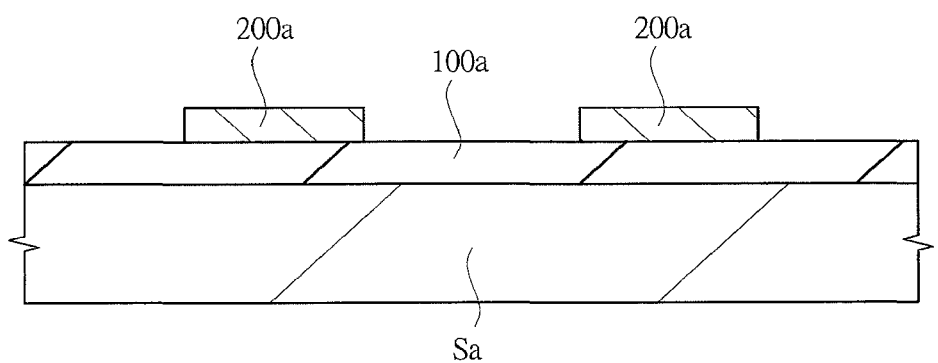
FIG. 3 is a cross-sectional view illustrating a manufacturing step of the semiconductor device of the first embodiment.

As illustrated in FIG. 3, the first substrate Sa having the formation layer 100a for the semiconductor element and the pad electrode 200a formed thereon is prepared. Note that the uppermost layer wire including the pad electrode 200a is formed by patterning a metal film (for example, an aluminum (Al) film) deposited thereon by a sputtering method.

Figure 4:
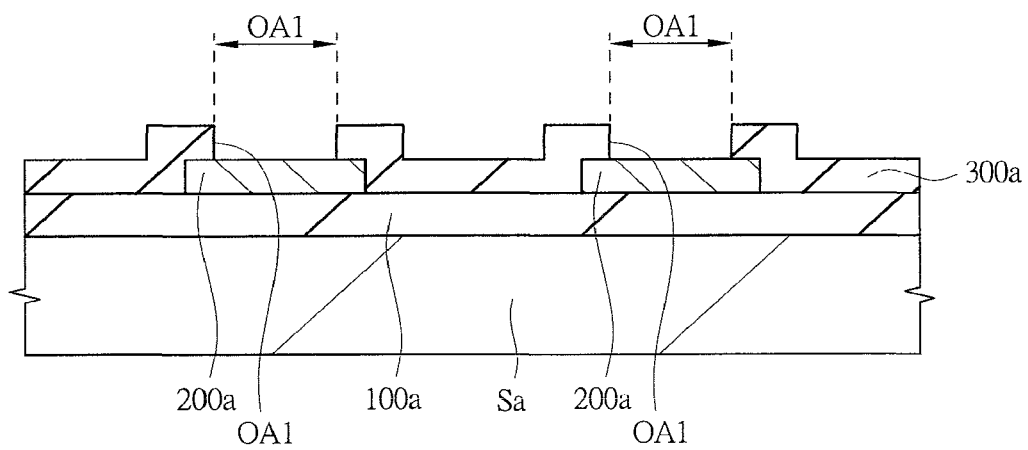
FIG. 4 is a cross-sectional view illustrating the manufacturing step of the semiconductor device of the first embodiment, which is a cross-sectional view in the manufacturing step of the semiconductor device continued from FIG. 3.

Next, for example, a silicon nitride film serving as the inorganic insulating film 300a is deposited on the pad electrode 200a by a CVD (Chemical Vapor Deposition) method or others. Next, by etching the inorganic insulating film 300a on the pad electrode 200a, the opening portion OA1 from which the surface of the pad electrode 200a is exposed is formed (FIG. 4). More specifically, a photoresist film (not illustrated) is formed on the inorganic insulating film 300a, and the photoresist film on the pad electrode 200a is removed by exposure and development. Next, the opening portion OA1 is formed by etching the inorganic insulating film 300a with using this photoresist film as a mask. Next, the photoresist film is removed by ashing or others. Such steps as the formation of the photoresist film to the removal thereof are referred to as patterning.

Figure 5:
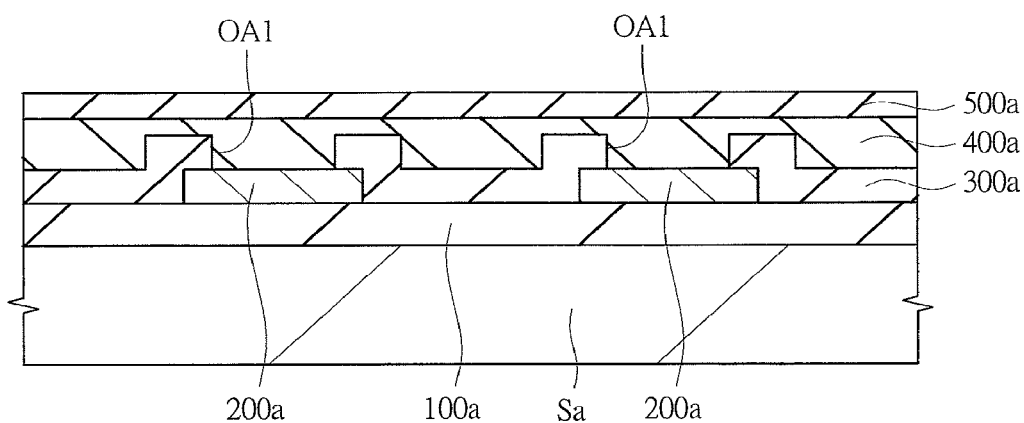
FIG. 5 is a cross-sectional view illustrating the manufacturing step of the semiconductor device of the first embodiment, which is a cross-sectional view in the manufacturing step of the semiconductor device continued from FIG. 4.

Next, as illustrated in FIG. 5, for example, a silicon oxide film serving as the inorganic insulating film 400a is deposited on an upper portion of the first substrate Sa including an upper portion of the opening portion OA1 so as to have a thickness of about 500 nm by the CVD method or others. At this time, a concavo-convex portion corresponding to an overlapped portion between the pad electrode 200a and the inorganic insulating film 300a is formed on the surface of the inorganic insulating film 400a. Next, the surface of the inorganic insulating film 400a is polished by a CMP (Chemical Mechanical Polishing) method. In this manner, the surface of the inorganic insulating film 400a is flattened. While the silicon oxide film is used as the inorganic insulating film 400a here, not only this but also a silicon nitride film or others can be used.

Next, on the inorganic insulating film 400a, the organic insulating film 500a is formed. Here, as the organic insulating film 500a, a photosensitive insulating film is used. As such a photosensitive organic insulating film 500a, for example, an insulating film (PBO film) made of polybenzoxazole (PBO) as a main component may be used. The PBO film can be formed by heating a polybenzoxazole precursor in a nitrogen atmosphere. The polybenzoxazole precursor compound is illustrated by [Chemical Formula 1] below. This compound is soluble in an alkaline solution. Therefore, as a precursor solution, an alkaline solution of the precursor compound [Chemical Formula 1] is used with further adding a photosensitizing agent (for example, naphthoquinone diazide compound) thereto. The ring closure of the precursor compound is caused by heating, so that a cured chemical compound illustrated by [Chemical Formula 2] is formed.

[Chemical Formula 1]

[Chemical Formula 2]

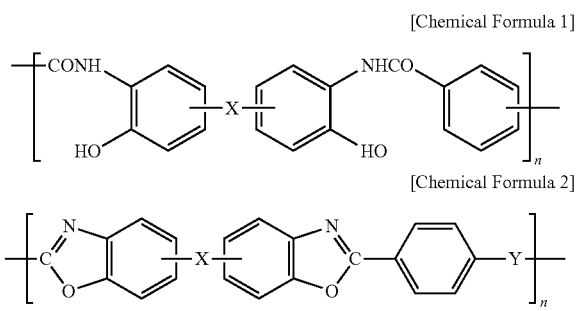

For example, by coating the main surface of the first substrate Sa with the precursor solution by using a spin coater, and then, performing a heating process thereon, the photosensitive organic insulating film (photosensitive resin film) 500a made of the PBO film is formed. A film thickness of the PBO film is about 1500 nm. This PBO film is made of a resin (heat-resistant resin, heat-resistant insulating film) having a higher heat resistance than that of a fluorine-based resin, and is preferably used for the present embodiment including a thermal compression-bonding step which will be described later.

Figure 6:
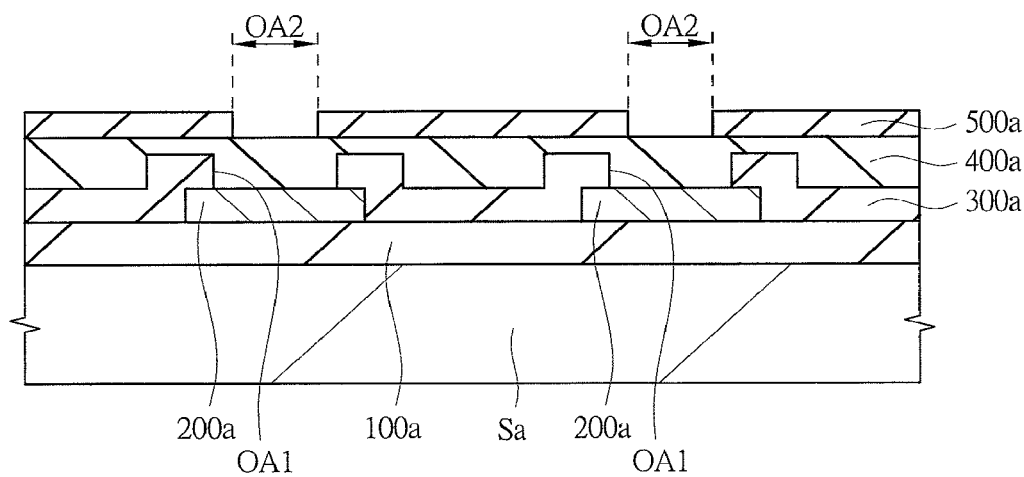
FIG. 6 is a cross-sectional view illustrating the manufacturing step of the semiconductor device of the first embodiment, which is a cross-sectional view in the manufacturing step of the semiconductor device continued from FIG. 5.

Next, by performing the exposure process by using an i-line stepper or others, the organic insulating film 500a in the formation region of the opening portion OA2 is exposed to light. Next, as illustrated in FIG. 6, by performing a developing process by using an alkaline developer or others, the exposed organic insulating film 500a is removed.

Figure 7:
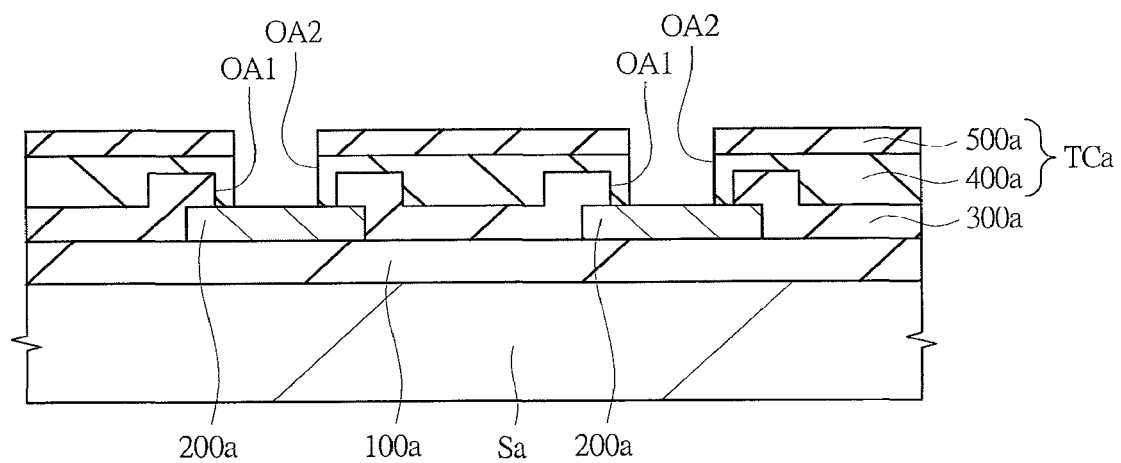
FIG. 7 is a cross-sectional view illustrating the manufacturing step of the semiconductor device of the first embodiment, which is a cross-sectional view in the manufacturing step of the semiconductor device continued from FIG. 6.

Next, as illustrated in FIG. 7, the inorganic insulating film 400a is etched by using a dry-etching method with using the organic insulating film 500a as a mask. For example, dry-etching gas is changed into plasma and is reacted with the inorganic insulating film 400a, so that an etching process is performed. As the dry-etching gas, for example, a fluorocarbon-based gas is used.

In this manner, the opening portion OA2 from which the pad electrode 200a is exposed is formed inside the laminated insulating film TCa formed of the inorganic insulating film 400a and the organic insulating film 500a. The formation region of the opening portion OA2 is positioned inside the formation region of the opening portion OA1, and has a shape (a planar shape viewed from above) of, for example, a circle shape whose diameter is about 5 μm.

Next, a surface treatment is performed on the surface of the organic insulating film 500a. As the surface treatment, for example, a hydrogen radical treatment is performed. A gas containing hydrogen (H) radicals is sprayed onto the surface of the organic insulating film 500a. In this manner, the surface of the organic insulating film 500a is modified. The modification includes removal (etching) of a surface constituent material of the organic insulating film 500a and change in a composition of a constituent material.

Figure 8:
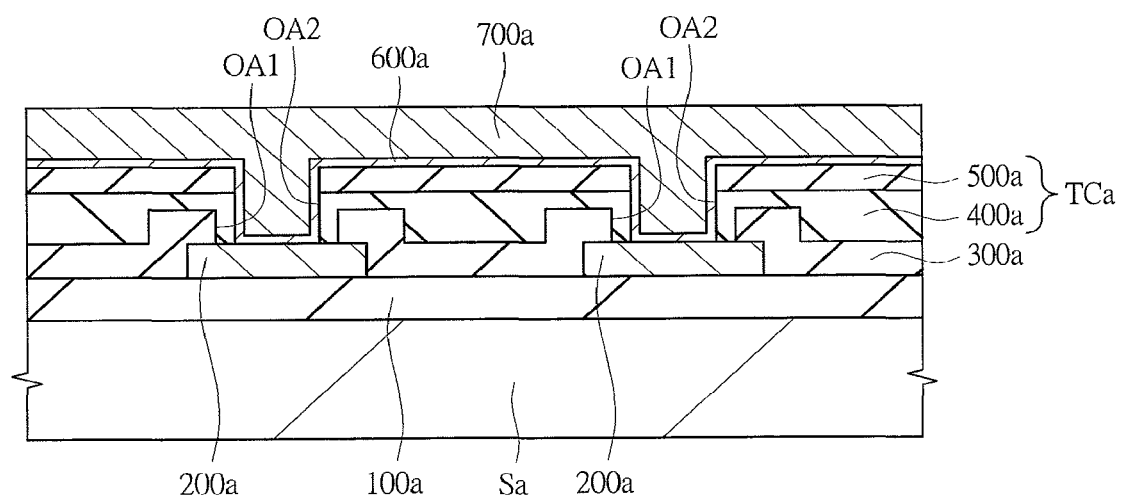
FIG. 8 is a cross-sectional view illustrating the manufacturing step of the semiconductor device of the first embodiment, which is a cross-sectional view in the manufacturing step of the semiconductor device continued from FIG. 7.

Next, as illustrated in FIG. 8, a barrier metal film 600a is formed on the organic insulating film 500a including the inside of the opening portion OA2. As the barrier metal film 600a, for example, a TiN (titanium nitride) film is deposited so as to have a thickness of about 70 nm by using a sputtering method or others. This barrier metal film 600a is formed in order to prevent diffusion of Cu (copper) into the organic insulating film 500a, the Cu being buried inside the opening portion OA2 in a later step.

Next, on the barrier metal film 600a, a Cu film having a film thickness of about 100 nm is deposited as a seed film (not illustrated) by the sputtering method. Next, on an upper portion of the seed film, a Cu film 700a is deposited so as to have a thickness of about 3 μm by using an electrolytic plating method. In this manner, the inside of the opening portion OA2 is filled with the Cu film 700a.

Figure 9:
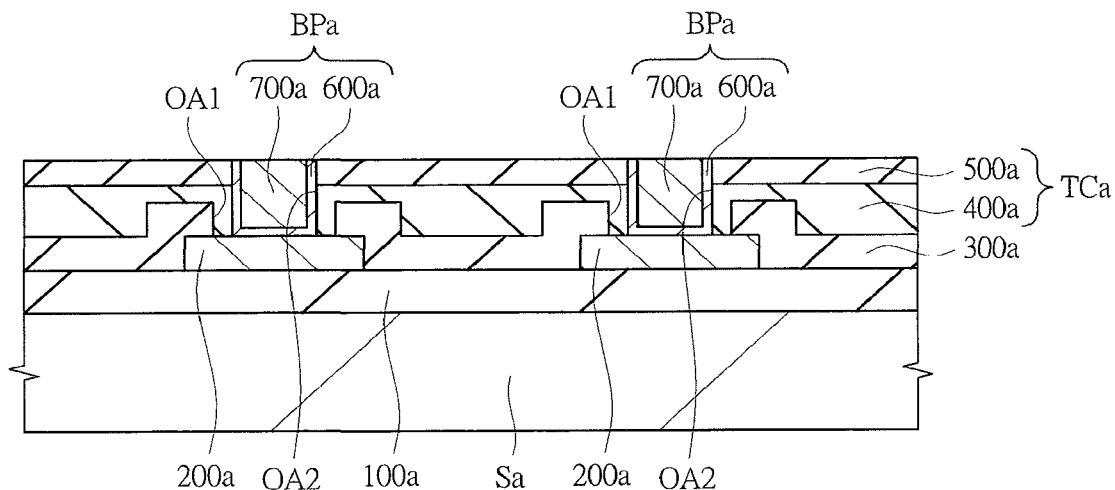
FIG. 9 is a cross-sectional view illustrating the manufacturing step of the semiconductor device of the first embodiment, which is a cross-sectional view in the manufacturing step of the semiconductor device continued from FIG. 8.

Next, as illustrated in FIG. 9, the Cu film 700a, the seed film, and the barrier metal film 600a on the organic insulating film 500a are polished by using the CMP method. In this manner, a bump electrode BPa formed of the Cu film 700a, the seed film, and the barrier metal film 600a is formed inside the opening portion OA2.

Next, the same processes as those for the first substrate Sa are performed on the second substrate Sb (see FIGS. 3 to 9). That is, an inorganic insulating film 300b having the opening portion OA1 is formed on the second substrate Sb, a laminated insulating film TCb formed of an inorganic insulating film 400b and an organic insulating film 500b is subsequently formed, and then, an opening portion OA2 is formed by a dry-etching process. Then, a surface treatment is performed on a surface of the organic insulating film 500b, and a bump electrode BPb formed of a Cu film 700b, a seed film, and a barrier metal film 600b is formed inside the opening portion OA2.

Figure 10:
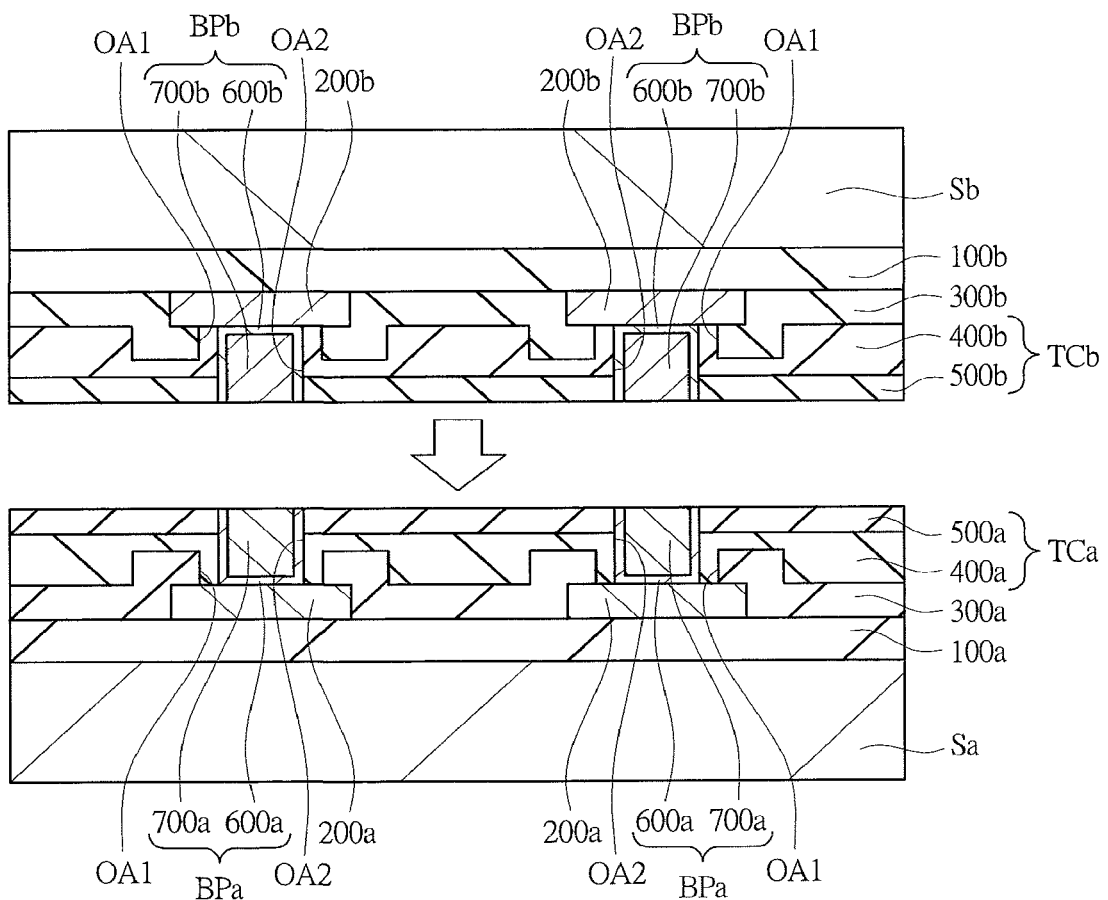
FIG. 10 is a cross-sectional view illustrating the manufacturing step of the semiconductor device of the first embodiment, which is a cross-sectional view in the manufacturing step of the semiconductor device continued from FIG. 9.

Next, as illustrated in FIG. 10, a front surface of the first substrate Sa (first surface, element surface, surface on the formation side for the bump electrode, surface on the formation side for the semiconductor element) and a front surface of the second substrate Sb (first surface, element surface, surface on the formation side for the bump electrode, surface on the formation side for the semiconductor element) are faced and overlapped to each other, and then, are compressed to be bonded under a high temperature such as 300° C. or higher, so that these substrates are bonded to each other (in the thermal compression-bonding, FIG. 1). At this time, the electrical connection between the bump electrodes (BPa and BPb) formed on the respective first substrate Sa and second substrate Sb and the bonding between the organic insulating films (500a and 500b) are simultaneously performed.

Then, each of a rear surface of the first substrate Sa (second surface, surface opposite to the surface on the formation side for the semiconductor element) and a rear surface of the second substrate Sb (second surface, surface opposite to the surface on the formation side for the semiconductor element) is polished (by the back-grinding process) so as to form a thin film whose substrate thickness is about 25 μm. Moreover, the first substrate Sa and the second substrate Sb in a wafer state are cut (diced) along scribe lines so as to be individual pieces (chipped).

By performing the above processes, a semiconductor device of the present embodiment illustrated in FIG. 1 is completed.

In the above-described processes, note that the surface treatment for the organic insulating films (500a and 500b) is performed subsequent to the formation of the opening portion OA2 but prior to the formation of the bump electrodes (BPa and BPb). However, the surface treatment for the organic insulating films (500a and 500b) may be performed subsequent to the formation of the bump electrodes (BPa and BPb) but prior to the thermal compression-bonding between the substrates.

As described above, according to the present embodiment, since the laminated insulating film TCa formed of the inorganic insulating film 400a and the organic insulating film 500a is used as the insulating film on the pad electrode 200a, and therefore, an amount of the organic insulating film 500a is comparatively reduced so that degassing (the desorbed gas) can be reduced in the heating and compression-bonding processes for the first substrate Sa and the second substrate Sb.

Therefore, the occurrence of voids upon the compression-bonding process can be suppressed. For example, when the insulating film on the pad electrode 200*a* is formed of only the organic insulating film, a film thickness thereof increases, and a degree of the degassing due to the heating increases. Moreover, the side wall of the opening portion is adversely formed into a tapered shape.

On the other hand, in the present embodiment, by using the above-described laminated insulating film TCa, the degassing can be reduced, the peeing between the substrates due to the bonding failure between the substrates can be reduced. Moreover, the connection failure between the bump electrodes can be reduced. As described above, the properties of the semiconductor device can be improved.

Moreover, according to the present embodiment, the surface treatment on the surface of the organic insulating film 500*a* is performed prior to the thermal compression-bonding between the substrates, and therefore, the adhesive property between the organic insulating films (500*a* and 500*b*) can be improved.

Hereinafter, explanation is made based on examination examples (experimental examples) of the present inventors. As a sample A, a thermal compression-bonding process was performed based upon the above-described processes (see FIGS. 3 to 9) on the first substrate Sa and the second substrate Sb in a wafer state, so that a laminated substrate A was manufactured. That is, with respect to the substrates (Sa, Sb), a surface treatment was performed on the organic insulating film (500*a*, 500*b*) subsequent to the formation of the opening portion OA2 but prior to the formation of the bump electrodes (BPa, BPb), and these substrates (Sa, Sb) were thermally compressed and bonded to each other. As a sample B, a thermal compression-bonding process was performed on each of the first substrate Sa and the second substrate Sb in a wafer state with the timing of the surface treatment being changed, so that a laminated substrate B was manufactured. That is, a surface treatment was performed on the organic insulating films (500*a*, 500*b*) subsequent to the formation of the bump electrodes (BPa, BPb) but prior to the thermal compression-bonding between the substrates, and these substrates (Sa, Sb) were thermally compressed and bonded to each other. As a sample C, the first substrate Sa and the second substrate Sb in a wafer state were thermally compressed and bonded to each other without performing the surface treatment thereon so that a laminated substrate C was manufactured.

With respect to these laminated substrates A to C, each of the first substrate Sa and the second substrate Sb was subjected to a back grinding treatment so as to have a film thickness of about 25 μm. Among them, with respect to the laminated substrate C, a peeling occurred between the substrates during the back grinding treatment. On the other hand, with respect to the laminated substrates A and B, no peeling was confirmed between the substrates. As a result of such a peeling test, it was found that the adhesive force between the substrates can be improved by the surface treatment on the inorganic insulating films (500*a*, 500*b*). Moreover, it was also found that the adhesive force between the substrates can be improved even when the timing of the surface treatment is changed as long as the surface treatment was performed prior to the thermal compression-bonding process.

As a result of examinations by the present inventors, it was considered that the difference in the adhesive force due to the presence or absence of the surface treatment is caused by dry-etching damages at the time of forming the opening portion OA2.

Therefore, in order to clarify an improving mechanism of the adhesive force between the substrates by the surface treatment, the following was studied. The PBO film was formed on a substrate, and an Ar (argon) plasma treatment was performed thereon as a damaging treatment, so that a substrate I was manufactured. This damaging treatment simulates an Ar plasma state caused by the dry-etching. Moreover, the PBO film was formed on a substrate, and after the Ar (argon) plasma treatment was performed thereon as the damaging treatment, a hydrogen radical treatment was performed thereon as the surface treatment, so that a substrate II was manufactured. Moreover, the PBO film was formed on a substrate, and both of the damaging treatment and the surface treatment are not performed thereon, so that a substrate III was manufactured as a reference.

Figure 51:
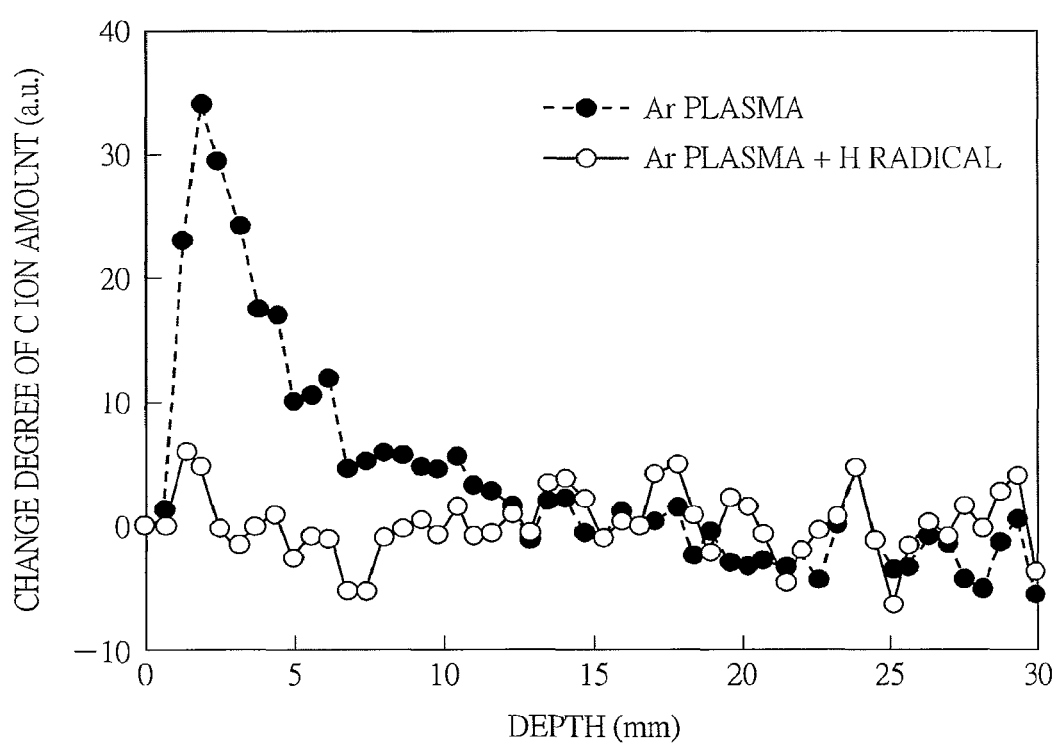
FIG. 51 is a graph illustrating a "C" ion amount on a surface portion of a PBO film.

With respect to these substrates (I, II and III), by using a Tof-SIMS (Time-of-flight secondary ion mass spectrometer), a C (carbon)-ion amount was measured on the surface portion (with a depth of 30 nm from the surface) of the PBO film, and a difference in the C-ion amount of the substrate III were calculated from the C-ion amounts of the substrate I and the substrate II. The results thereof are illustrated in a graph of FIG. 51. FIG. 51 illustrates a graph indicating a C-ion amount on the surface portion of the PBO film. A longitudinal axis of the graph indicates a change degree (a.u.) of the C-ion amount. Moreover, a horizontal axis of the graph indicates the depth (nm) from the PBO film surface.

As illustrated in the graph, it is found that the C-ion amount on the surface of the PBO film is increased by the Ar plasma treatment. On the other hand, when the hydrogen radical treatment was performed subsequent to the Ar plasma treatment, the C-ion amount was the same degree (in a range of ±5%) as that of the reference. Moreover, variation in the C-ion amount in the surface portion (with the depth of 30 nm from the surface) of the PBO film was not as large as that of the Ar plasma treatment, and was the same degree as that of the reference.

From the results described above, it is considered that, in the organic insulating films (500*a*, 500*b*) exposed to the plasma of Ar or others at the time of the dry-etching process, its surface is carbonated to cause such a change in a film property as to form a graphite structure or others, a damaged layer is formed, which results in the reduction in the adhesive property.

On the other hand, when the hydrogen radical treatment is performed subsequent to the Ar plasma treatment, it is considered that the above-described damaged layer is etched, or the damaged layer is chemically changed, and the film property is recovered.

In this manner, it has been found that the adhesive property between the substrates can be improved by performing the surface treatment (for example, hydrogen plasma treatment) on the surfaces (of the organic insulating films 500*a* and 500*b*) of each of the substrates subsequent to the dry-etching the organic insulating films (500*a*, 500*b*) but prior to the thermal compression-bonding between the substrates (Sa, Sb).

Here, in the present embodiment, the PBO film is used as the organic insulating film (500*a*, 500*b*). However, in addition to this, an organic insulating film made of polyimide as a main component, an organic insulating film made of benzocyclobutene as a main component, or others may be used. These films are also heat-resistant insulating films, and are preferably used for the present embodiment including the thermal compression-bonding process. In the present embodiment, the heat-resistant insulating film is defined as an insulating film whose temperature causing a weight loss of 1% is about 300° C. or higher.

Moreover, as the PBO film and polyimide, there are many types having a positive-type photosensitive property. Therefore, a solvent-free developer can be used by selecting them, and effects on the environment can be reduced. Moreover, when benzocyclobutene is used, side products are difficult to be caused in the cyclization reaction of the host framework, and an organic insulating film having superior characteristics can be formed. Even when the organic insulating film is formed by using the above-described material, gas is easy to be caused due to heating if the film is used as a single layer. Therefore, by forming the insulating film on the pad electrode 200*a* as the laminated structure of the inorganic insulating film and the organic insulating film, the degassing degree can be reduced.

Moreover, the above-described materials are also carbon-content chemical compounds, and there is a concern about the generation of the damaged layer at the time of the dry-etching process. Therefore, by performing a surface treatment (for example, hydrogen plasma treatment) thereon, the adhesive property between the substrates can be improved.

Moreover, in the present embodiment, a silicon oxide film formed by the CVD method is used as the inorganic insulating film 400*a*, and the surface thereof is polished by the CMP method. However, by using a coated insulating film as the inorganic insulating film 400*a*, the flattening may be performed simultaneously with the film formation, and therefore, the polishing process may be eliminated.

Further, as described above, the timing of the surface treatment may be either of (1) subsequent to the formation of the opening portion OA2 but prior to the formation of the bump electrodes (BPa, BPb) or (2) subsequent to the formation of the bump electrodes (BPa, BPb) but prior to the thermal compression-bonding between the substrates, or may be both of the timings.

In the present embodiment, the hydrogen radical treatment is exemplified as the surface treatment. However, in addition to this, a hydrogen plasma treatment, an ammonia radical treatment, an ammonia plasma treatment, an oxygen plasma treatment, or an oxygen radical treatment may be performed. That is, a treatment under atmosphere of gas having such active species or a treatment of spraying the gas is performed.

Note that, in the ammonia radical treatment and the ammonia plasma treatment, a nitriding action is caused by nitrogen (N) which is a constituent element of ammonia. Therefore, this treatment is effect in a case of using a metal which is difficult to be nitrided as the bump electrodes (BPa, BPb). Moreover, in the oxygen plasma treatment and the oxygen radical treatment, an oxidizing action is caused. Therefore, this treatment is effect in a case of using a metal which is difficult to be oxidized as the bump electrodes (BPa, BPb). Note that, when an undesired oxidation is caused, an oxidized metal may be modified into a metal by performing a thermal treatment (reduction treatment) or others under reducing atmosphere in a later step.

In the present embodiment, the organic insulating films (500*a*, 500*b*) whose compositions are the same as each other and the bump electrodes (BPa, BPb) whose compositions are the same as each other are bonded. However, the constituent metal of the other hump electrode (for example, BPb) may be a different one. Alternatively, the other organic insulating film (for example, 500*b*) may be another insulating film (for example, an inorganic insulating film).

Further, in the present embodiment, the first substrate Sa and the second substrate Sb in the wafer state thermally compressed and bonded, and then, are cut (diced) so as to be individual pieces (chipped). However, each of the first substrate Sa and the second substrate Sb in the wafer state may be formed so as to be individual pieces, and then, thermally compressed and bonded.

Second Embodiment

In the first embodiment, on the pad electrode 200*a* formed by patterning the metal film, the inorganic insulating film 300*a* is deposited (FIG. 4). However, in a second embodiment, a wiring trench is formed inside the inorganic insulating film 300*a*, and a metal film (for example, Cu (copper) film) is buried inside this wiring trench, so that the pad electrode 200*a* is formed.

Figure 11:
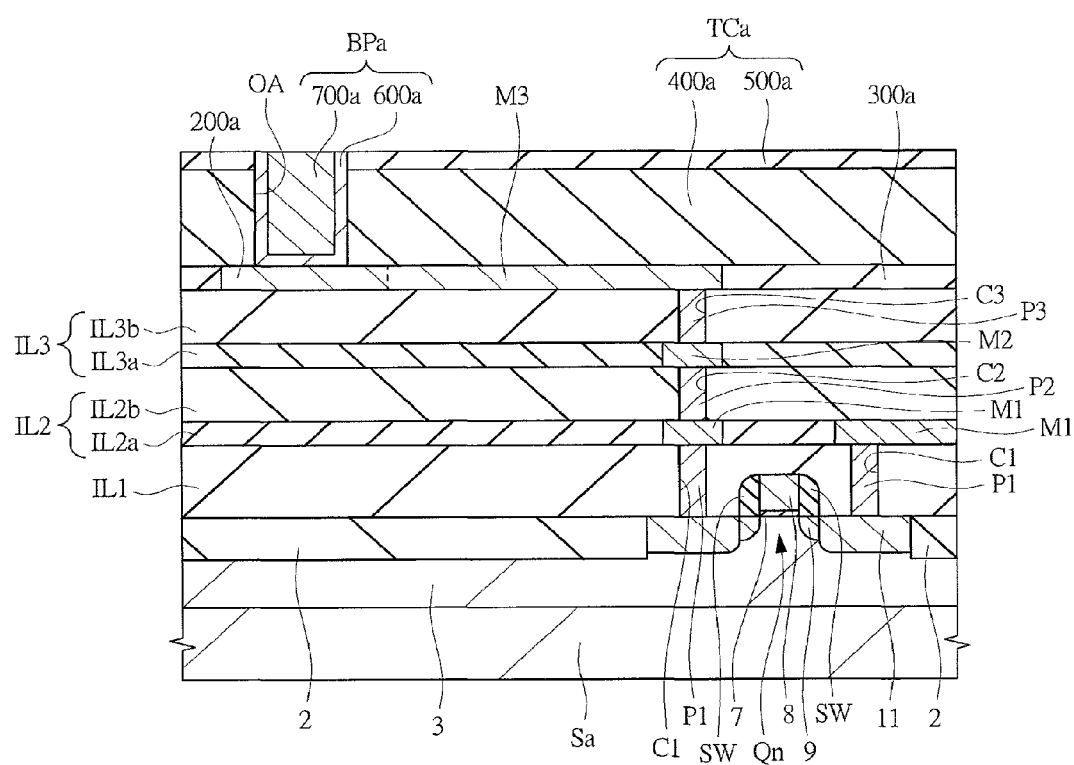
FIG. 11 is a cross-sectional view illustrating a structural example of a first substrate having a MISFET in a formation layer for a semiconductor element.

With reference to drawings, a structure and manufacturing steps of the semiconductor device of the present embodiment are explained. FIG. 11 is a cross-sectional view illustrating a structural example of a first substrate having the MISFET in the formation layer for the semiconductor element. FIGS. 12 to 18 are cross-sectional views illustrating the manufacturing steps of the semiconductor device of the present embodiment.

[Explanation of Structure]

Figure 18:
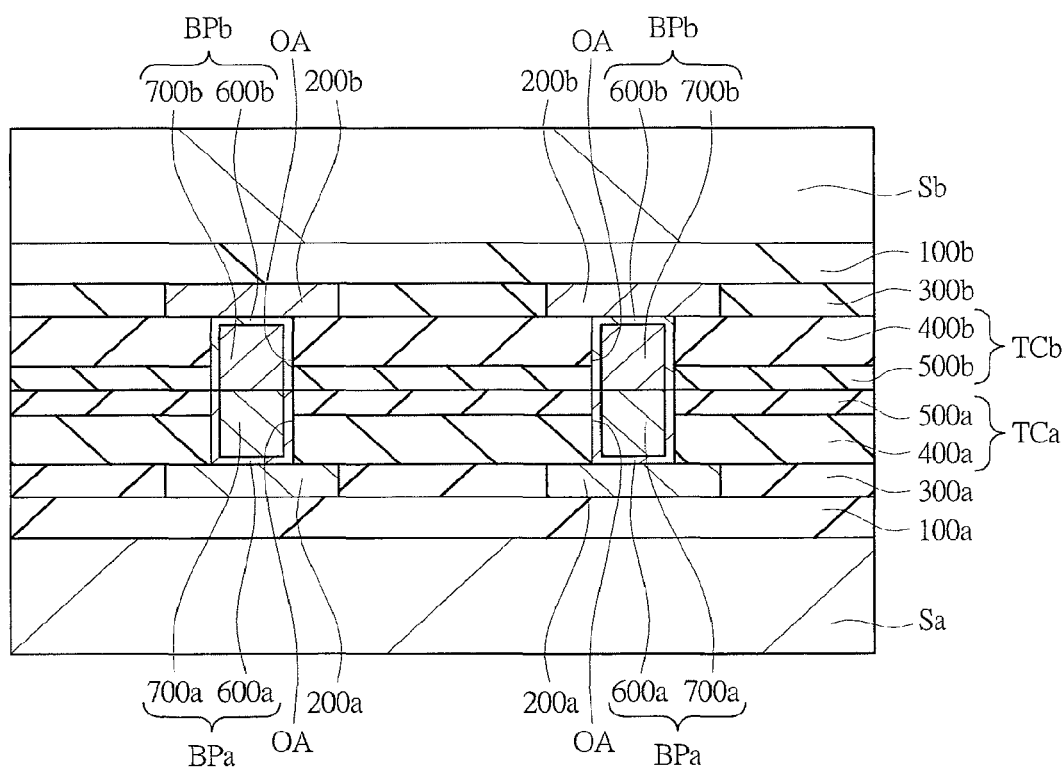
FIG. 18 is a cross-sectional view illustrating the manufacturing step of the semiconductor device of the second embodiment, which is a cross-sectional view in the manufacturing step of the semiconductor device continued from FIG. 17.

As illustrated in FIG. 18 that is one of the cross-sectional views illustrating the manufacturing steps of the semiconductor device of the present embodiment, the semiconductor device of the present embodiment has the laminated structure formed of the first substrate Sa and the second substrate Sb.

A different point from FIG. 1 of the first embodiment is that the pad electrode 200*a* is buried inside the wiring trench inside the inorganic insulating film 300*a*. Therefore, in the present embodiment, as different from the first embodiment, the convex-concavo portion corresponding to the overlapped portion between the pad electrode 200*a* and the inorganic insulating film 300*a* is not caused, so that the surface of the pad electrode 200*a* and the surface of the inorganic insulating film 300*a* are on the same level. In other words, the surface of the pad electrodes 200*a* and the surface of the inorganic insulating film 300*a* are flattened. Moreover, the same goes for the pad electrode 200*b* and the inorganic insulating film 300*b* of the second substrate Sb. Note that, since the structures of other parts are the same as those of the first embodiment (FIG. 1), the explanation thereof will be omitted.

Also in the present embodiment, on the pad electrode 200*a*, the opening portion OA that is opened by dry-etching the laminated insulating film TCa of the inorganic insulating film 400*a* and the organic insulating film 500*a* is arranged. Moreover, on the pad electrode 200*b*, the opening portion OA that is opened by dry-etching the laminated insulating film TCb of the inorganic insulating film 400*b* and the organic insulating film 500*b* is arranged. Moreover, the surface treatment is performed on each of the organic insulating films 500*a* and 500*b*.

Further, inside the opening portion OA on the pad electrode 200*a* and inside the opening portion OA on the pad electrode 200*b*, the bump electrodes BPa and BPb are arranged, respectively.

In FIG. 18, the surface side of the first substrate Sa and the surface side of the second substrate Sb are bonded to each other so that the organic insulating films (500*a*, 500*b*) and the bump electrodes (BPa, BPb) are in contact with each other.

Note that the elements to be formed in the formation layers (100*a*, 100*b*) for the semiconductor elements positioned in the lower layers of the pad electrodes (200*a*, 200*b*) are not limited, and a MISFET or others can be arranged as similar to the first embodiment (FIG. 2). However, while the wires (M1 to M3) are formed by the patterning in FIG. 2, these may be formed by the burying of a metal film. For example, as illustrated in FIG. 11, a plug P1 is arranged inside the interlayer insulating film IL1 on the MISFET (Qn). The structures of the MISFET (Qn), the interlayer insulating film IL1 and the plug P1 are the same as those of the first embodiment (FIG. 2).

Here, on the interlayer insulating film IL1, a wire M1 buried in a wiring-trench insulating film IL2a is arranged. An interlayer insulating film IL2b is arranged on the wire M1, and a plug P2 is arranged in the interlayer insulating film IL2b. Moreover, on the interlayer insulating film IL2b, a wire M2 buried in a wiring-trench insulating film IL3a is arranged. An interlayer insulating film IL3b is arranged on the wire M2, and a plug P3 is arranged in the interlayer insulating film IL3b. Moreover, on the interlayer insulating film IL3b, a wire M3 buried in the inorganic insulating film 300a is arranged. Here, the wire M3 is the uppermost layer wire, and a part thereof becomes the pad electrode 200a. In this manner, the wires M1 to M3 may be provided as buried wires (Damascene wires).

[Explanation of Manufacturing Method]

Next, the manufacturing steps of the semiconductor device of the present embodiment are explained, and besides, the structure of the semiconductor device of the present embodiment is further clarified.

Figure 12:
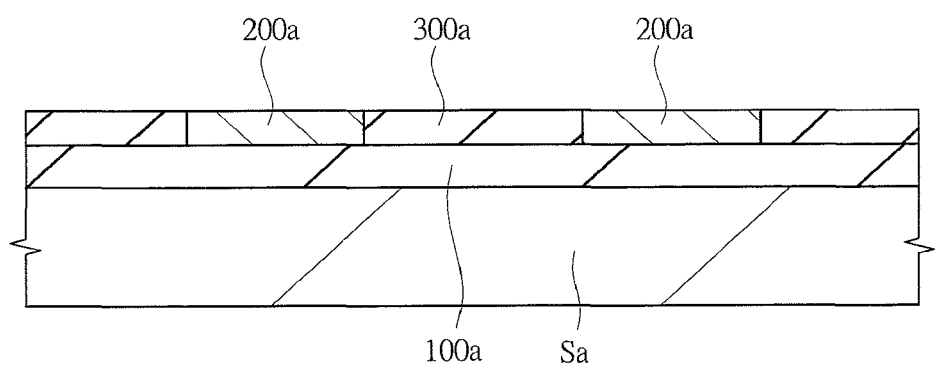
FIG. 12 is a cross-sectional view illustrating a manufacturing step of a semiconductor device of a second embodiment.

As illustrated in FIG. 12, the first substrate Sa having the formation layer 100a for the semiconductor element and the pad electrode 200a formed thereon is prepared. Note that the uppermost layer wire including the pad electrode 200a is formed by burying a metal film (for example, a Cu film) in the wiring trench inside the inorganic insulating film 300a.

Figure 13:
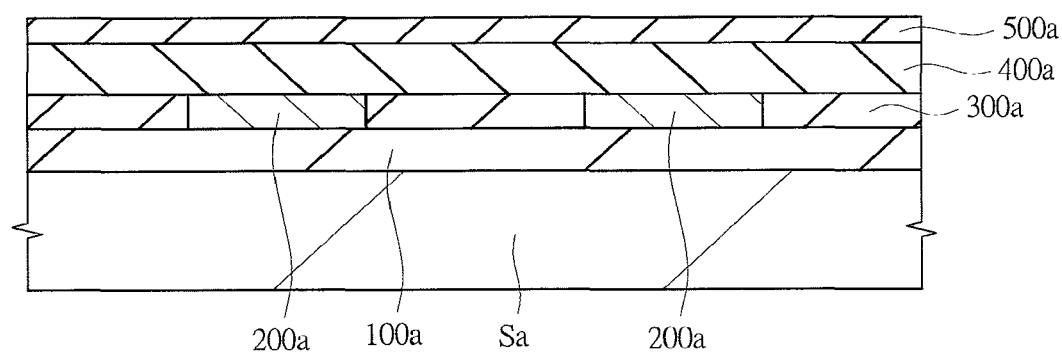
FIG. 13 is a cross-sectional view illustrating the manufacturing step of the semiconductor device of the second embodiment, which is a cross-sectional view in the manufacturing step of the semiconductor device continued from FIG. 12.

Next, as illustrated in FIG. 13, for example, a silicon oxide film serving as the inorganic insulating film 400a is deposited on the inorganic insulating film 300a including the upper portion of the pad electrode 200a by the CVD method or others so as to have a thickness of about 500 nm. At this time, since the surface of the pad electrode 200a and the surface of the inorganic insulating film 300a have almost the same height as each other, and are flattened, the surface of the inorganic insulating film 400a is also almost flattened. Therefore, the polishing step for the surface of the inorganic insulating film 400a in the first embodiment can be eliminated.

Next, on the inorganic insulating film 400a, an organic insulating film 500a is formed. Here, a PBO film is formed as the organic insulating film 500a as similar to the first embodiment.

Figure 14:
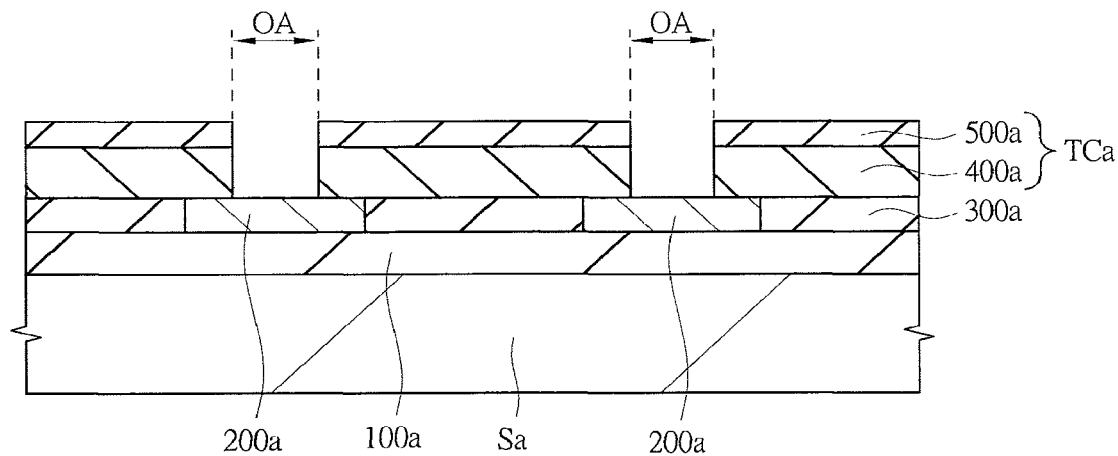
FIG. 14 is a cross-sectional view illustrating the manufacturing step of the semiconductor device of the second embodiment, which is a cross-sectional view in the manufacturing step of the semiconductor device continued from FIG. 13.

Next, as illustrated in FIG. 14, as similar to the first embodiment, an opening portion OA is formed in the organic insulating film 500a by exposure and development processes, and the inorganic insulating film 400a is further dry-etched with using the organic insulating film 500a as a mask. Thus, the opening portion OA from which the pad electrode 200a is exposed is formed inside the laminated insulating film TCa of the inorganic insulating film 400a and the organic insulating film 500a.

Next, a surface treatment is performed on the surface of the organic insulating film 500a. As the surface treatment, for example, gas containing hydrogen radicals is sprayed onto the surface of the organic insulating film 500a. Thus, the surface of the organic insulating film 500a is modified.

Figure 15:
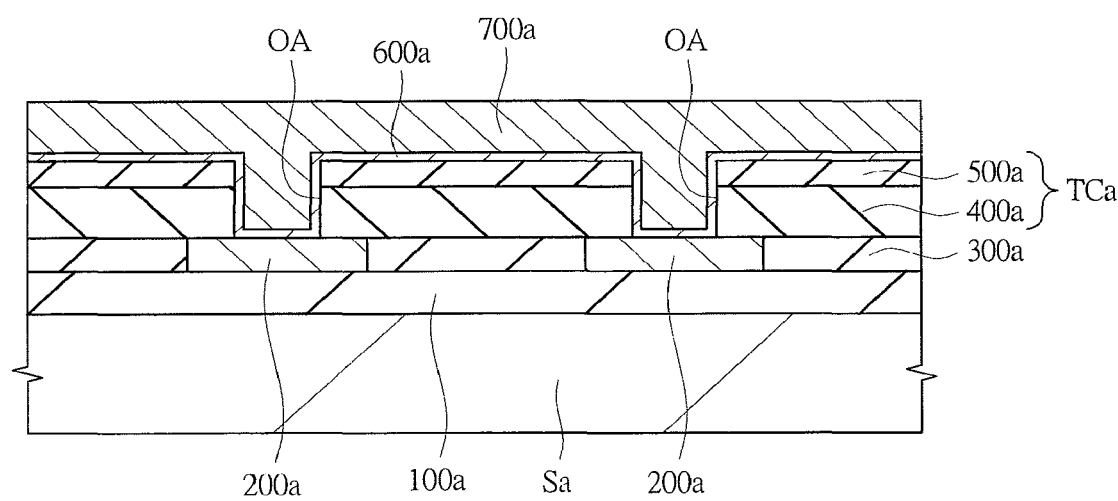
FIG. 15 is a cross-sectional view illustrating the manufacturing step of the semiconductor device of the second embodiment, which is a cross-sectional view in the manufacturing step of the semiconductor device continued from FIG. 14.

Next, as illustrated in FIG. 15, a barrier metal film 600a, a seed film (not illustrated) and a Cu film 700a are formed on the organic insulating film 500a including the inside of the opening portion OA as similar to the first embodiment.

Figure 16:
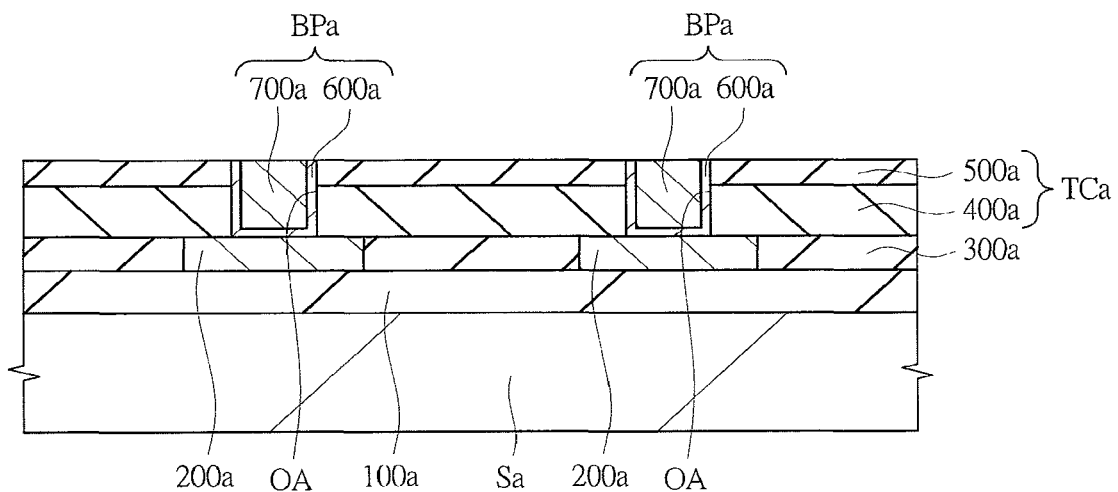
FIG. 16 is a cross-sectional view illustrating the manufacturing step of the semiconductor device of the second embodiment, which is a cross-sectional view in the manufacturing step of the semiconductor device continued from FIG. 15.

Next, as illustrated in FIG. 16, the Cu film 700a, the seed film and the barrier metal film 600a on the organic insulating film 500a are polished by using the CMP method. Thus, a bump electrode BPa formed of the Cu film 700a, the seed film and the barrier metal film 600a is formed inside the opening portion OA2.

Next, the same treatments as those on the first substrate Sa are performed on the second substrate Sb (see FIGS. 12 to 16). That is, the opening portion OA is formed by forming the laminated insulating film TCb of the inorganic insulating film 400b and the organic insulating film 500b, and then, performing the dry-etching process thereon. Then, a surface treatment is performed on the surface of the organic insulating film 500b, and a bump electrode BPb formed of a Cu film 700b, a seed film and a barrier metal film 600b is formed inside the opening portion OA.

Figure 17:
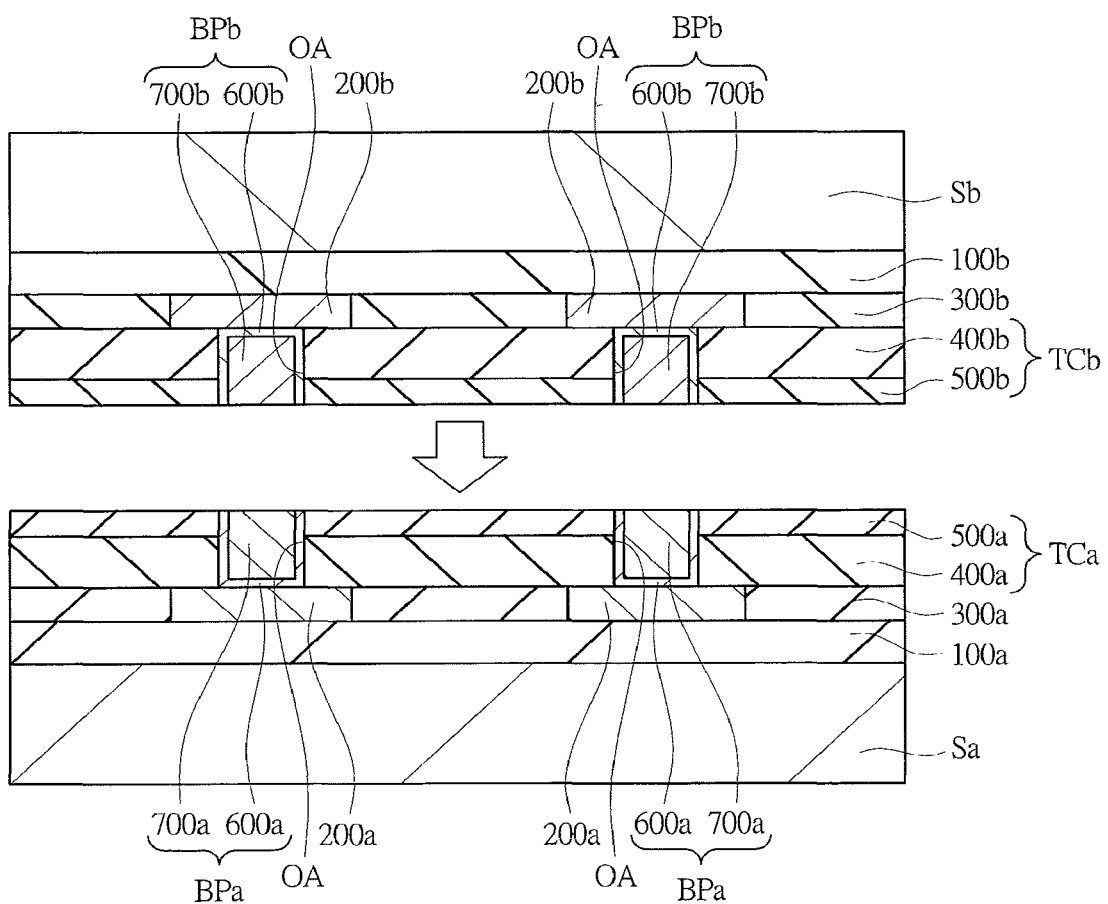
FIG. 17 is a cross-sectional view illustrating the manufacturing step of the semiconductor device of the second embodiment, which is a cross-sectional view in the manufacturing step of the semiconductor device continued from FIG. 16.

Next, as illustrated in FIG. 17, a front surface of the first substrate Sa (first surface, element surface, surface on the formation side of the bump electrode, surface on the formation side of the semiconductor element) and a front surface of the second substrate Sb (first surface, element surface, surface on the formation side of the bump electrode, surface on the formation side of the semiconductor element) are faced and overlapped with each other, and then, are compressed and bonded under a high temperature, so that these substrates are bonded to each other (in thermal compression-bonding). At this time, electrical connections between the bump electrodes (BPa, BPb) formed on the respective first substrate Sa and second substrate Sb and bonding between the organic insulating films (500a, 500b) are simultaneously performed.

Then, each of a rear surface of the first substrate Sa (second surface, surface opposite to the surface on the formation side of the semiconductor element) and a rear surface of the second substrate Sb is subjected to a back grinding process so as to be a thin film whose substrate thickness is about 25 Moreover, the first substrate Sa and the second substrate Sb in the wafer state are cut along scribe lines so as to be individual pieces.

By performing the above processes, a semiconductor device of the present embodiment illustrated in FIG. 18 is completed.

Note that, in the above-described processes, the surface treatment on the organic insulating films (500a, 500b) is performed subsequent to the formation of the opening portion OA but prior to the formation of the bump electrodes (BPa, BPb). However, the surface treatment on the organic insulating films (500a, 500b) may be performed subsequent to the formation of the bump electrodes (BPa, BPb) but prior to the thermal compression-bonding between the substrates.

As described above, according to the present embodiment, the laminated insulating film TCa of the inorganic insulating film 400a and the organic insulating film 500a is used as the insulating film on the pad electrode 200a, and therefore, the degassing from the organic insulating film 500a can be reduced in the heating and compression-bonding processes for the first substrate Sa and the second substrate Sb. Therefore, the occurrence of voids upon the compression-bonding process can be suppressed, and the peeling between the substrates due to the bonding failure between the substrates can be reduced. Moreover, the connection failure between the bump electrodes can be reduced. Thus, the characteristics of the semiconductor device can be improved.

Moreover, according to the present embodiment, the surface treatment is performed on the surface of the organic insulating film 500a prior to the thermal compression-bonding between the substrates, and therefore, the adhesive property between the organic insulating films (500a, 500b) can be improved.

Third Embodiment

In the first and second embodiments, the bump electrode BPa is formed on the front surface side (first surface, element surface, surface on the formation side of the bump electrode, surface on the formation side of the semiconductor element) of the first substrate Sa. However, in a third embodiment, the bump electrode BP is formed on the rear surface side (second surface, surface on the side opposite to the formation side of the semiconductor element) of the first substrate Sa.

Hereinafter, with reference to drawings, a structure and manufacturing steps of a semiconductor device of the present embodiment are explained. FIGS. 19 to 26 are cross-sectional views illustrating the manufacturing steps of the semiconductor device of the present embodiment.

[Explanation of Structure]

Figure 25:
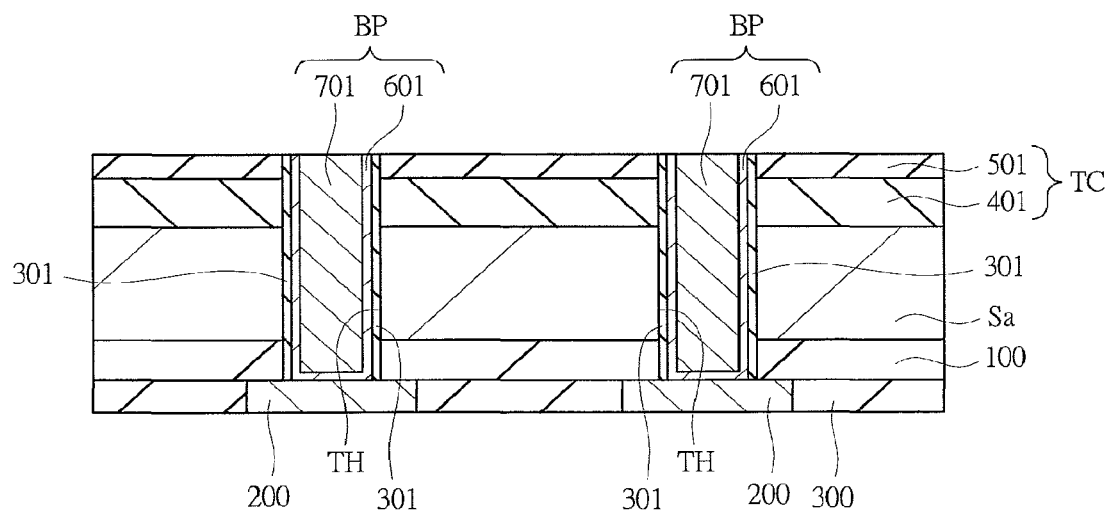
FIG. 25 is a cross-sectional view illustrating the manufacturing step of the semiconductor device of the third embodiment, which is a cross-sectional view in the manufacturing step of the semiconductor device continued from FIG. 24.

In FIG. 25 that is one of the cross-sectional views illustrating the manufacturing steps of the semiconductor device of the present embodiment, the rear surface of the first substrate Sa (second surface, surface on the side opposite to the formation side of the semiconductor element) is illustrated as an upper side. Therefore, the formation layer for the semiconductor element (the inner layer of the semiconductor element) 100 formed on the front surface (first surface, element surface, surface on the formation side of the semiconductor element) of the first substrate Sa is positioned on a lower side of the first substrate Sa. Further below the formation layer 100 for the semiconductor element, the pad electrode (conductive film) 200 is arranged.

Moreover, on the rear surface of the first substrate Sa, a laminated insulating film TC formed of an inorganic insulating film 401 and an organic insulating film 501 is arranged. In these laminated insulating film TC, first substrate Sa, and formation layer for the semiconductor element (the inner layer of the semiconductor element) 100, an opening portion (through hole) TH which penetrates therethrough and reaches the pad electrode 200 is provided. A bump electrode BP is arranged inside the opening portion TH.

Figure 26:
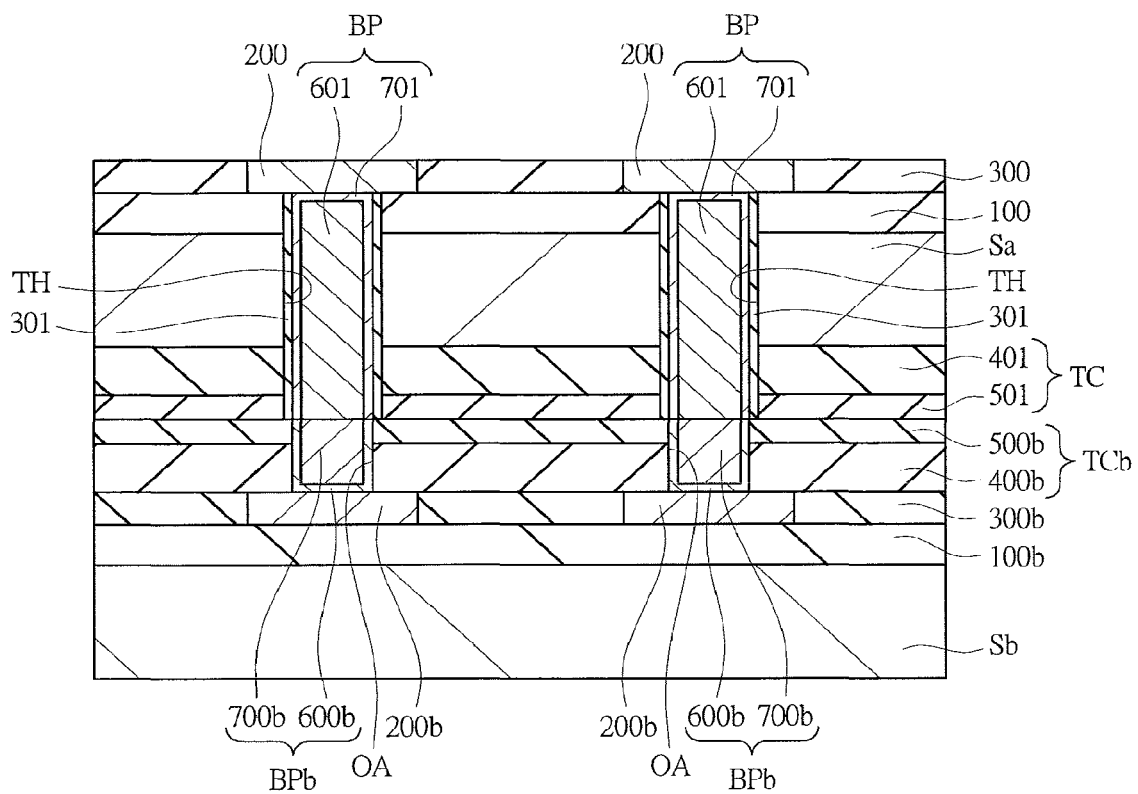
FIG. 26 is a cross-sectional view illustrating the manufacturing step of the semiconductor device of the third embodiment, which is a cross-sectional view in the manufacturing step of the semiconductor device continued from FIG. 25.

In the semiconductor device of the present embodiment, as illustrated in FIG. 26, the rear surface side of the first substrate Sa and the front surface side of the second substrate Sb explained in the second embodiment are bonded with each other so that the organic insulating films (501 and 500b) are in contact with each other as well as the bump electrodes (BP and BPb) are in contact with each other.

Also in the present embodiment, an opening portion TH that is opened by dry-etching the laminated insulating film Tc of the inorganic insulating film 401 and the organic insulating film 501 is arranged in the upper portion of the pad electrode 200 (FIG. 25). Moreover, a surface treatment is performed on the organic insulating film 501.

[Explanation of Manufacturing Method]

Next, the manufacturing steps of the semiconductor device are explained of the present embodiment is explained, and besides, the structure of the semiconductor device of the present embodiment is further clarified.

Figure 19:
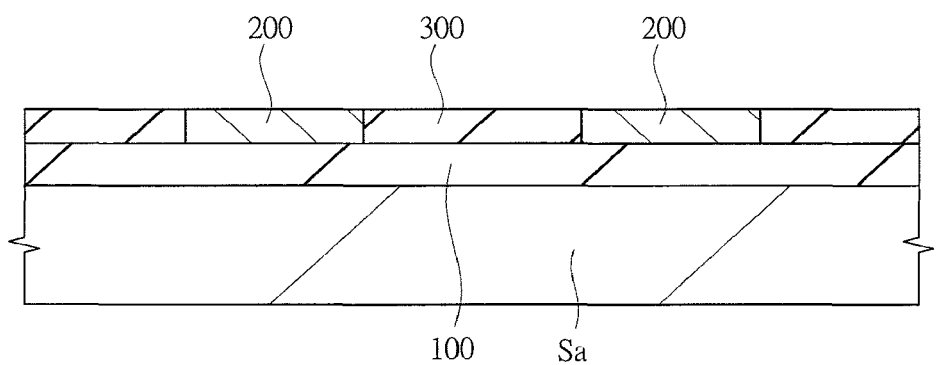
FIG. 19 is a cross-sectional view illustrating a manufacturing step of a semiconductor device of a third embodiment.

As illustrated in FIG. 19, the first substrate Sa having the formation layer 100 for the semiconductor element and the pad electrode 200 formed thereon is prepared. Note that the uppermost layer wire including the pad electrode 200 is formed by burying a metal film (for example, a Cu film) in the wiring trench inside the inorganic insulating film 300 as similar to the second embodiment.

Figure 20:
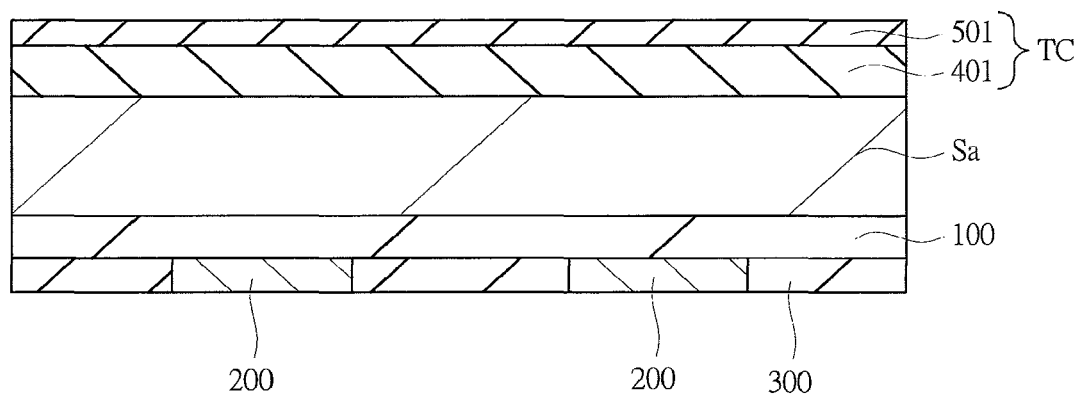
FIG. 20 is a cross-sectional view illustrating the manufacturing step of the semiconductor device of the third embodiment, which is a cross-sectional view in the manufacturing step of the semiconductor device continued from FIG. 19.

Next, the back grinding process is performed so that the thickness of the first substrate Sa is a predetermined thickness (for example, about 25 μm) when the rear surface of the first substrate Sa (which is the second surface, surface on the side opposite to the formation side of the semiconductor element) is set as the upper side. Next, as illustrated in FIG. 20, for example, a silicon oxide film is deposited on the first substrate Sa as an inorganic insulating film 401 by using the CVD method or others so as to have a thickness of about 500 nm.

Next, on the inorganic insulating film 401, an organic insulating film 501 is formed. Here, as similar to the first embodiment, the PBO film is formed as the organic insulating film 501.

Figure 21:
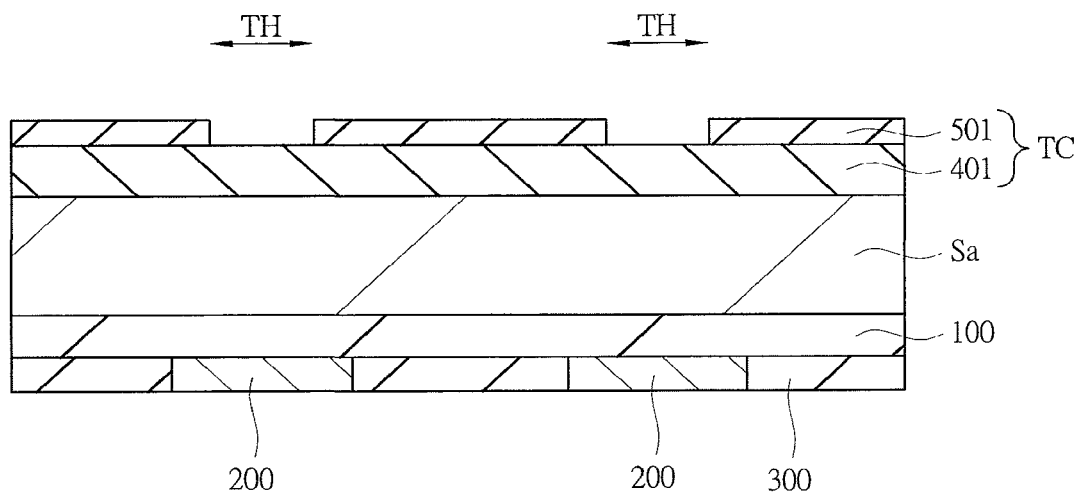
FIG. 21 is a cross-sectional view illustrating the manufacturing step of the semiconductor device of the third embodiment, which is a cross-sectional view in the manufacturing step of the semiconductor device continued from FIG. 20.
Figure 22:
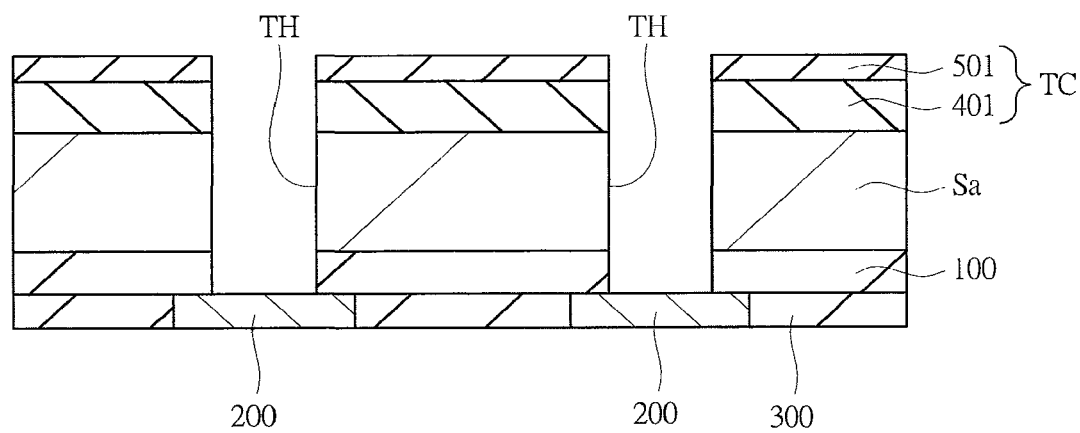
FIG. 22 is a cross-sectional view illustrating the manufacturing step of the semiconductor device of the third embodiment, which is a cross-sectional view in the manufacturing step of the semiconductor device continued from FIG. 21.

Next, as illustrated in FIG. 21, the organic insulating film 501 in the formation region for the opening portion TH is removed by the exposure and development processes. Next, as illustrated in FIG. 22, the inorganic insulating film 401, the first substrate Sa and the formation layer 100 for the semiconductor elements are etched with using the organic insulating film 501 as a mask. Thus, the opening portion TH is formed so as to penetrate through the inorganic insulating film 401, the organic insulating film 501, the first substrate Sa, and the formation layer 100 for the semiconductor element and reach the pad electrode 200. A formation region of the opening portion TH is laid out in association with the pad electrode 200, and is previously designed so that no semiconductor element is formed in this region.

Next, a surface treatment is performed on the surface of the organic insulating film 501 (which is the rear surface of the first substrate Sa). As the surface treatment, for example, gas containing hydrogen radicals is sprayed onto the surface of the organic insulating film 501. Thus, the surface of the organic insulating film 501 is modified.

Figure 23:
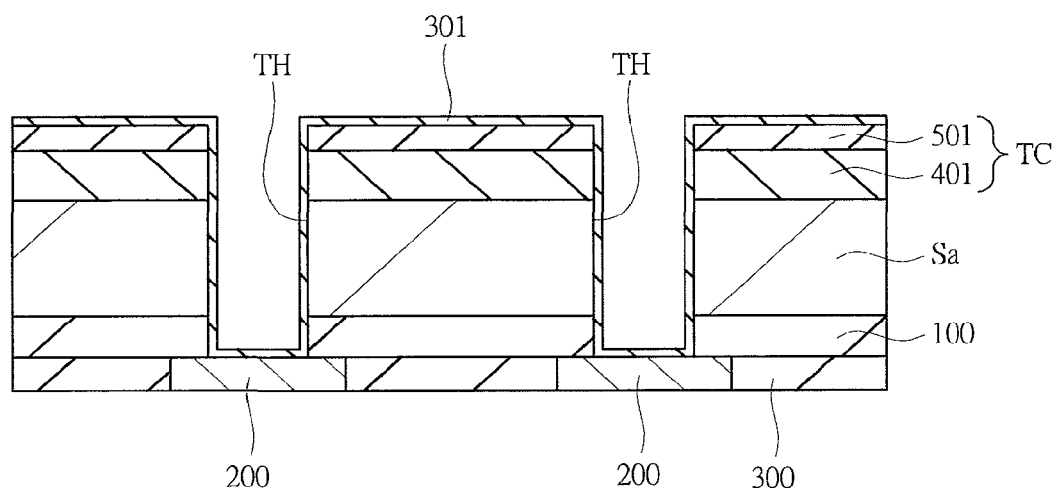
FIG. 23 is a cross-sectional view illustrating the manufacturing step of the semiconductor device of the third embodiment, which is a cross-sectional view in the manufacturing step of the semiconductor device continued from FIG. 22.
Figure 24:
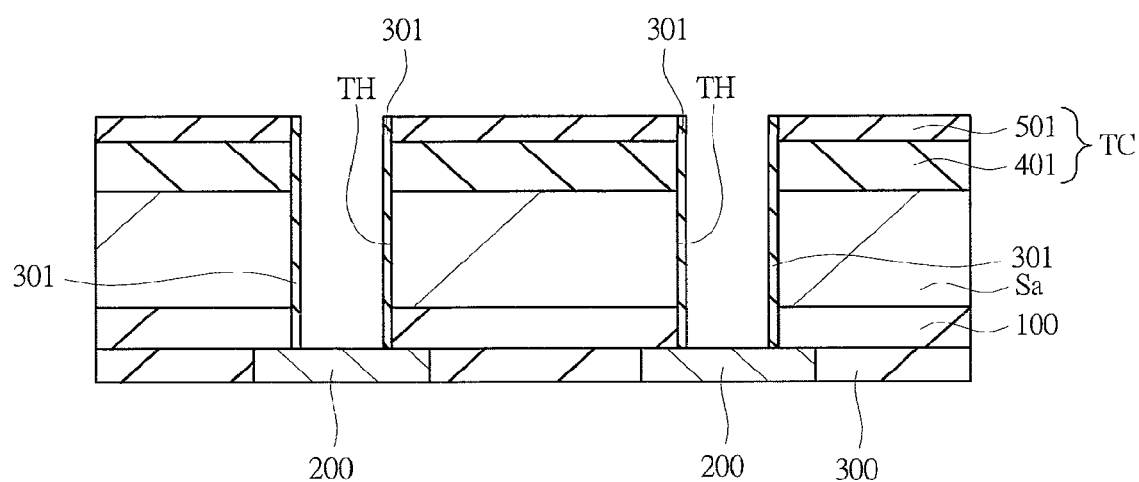
FIG. 24 is a cross-sectional view illustrating the manufacturing step of the semiconductor device of the third embodiment, which is a cross-sectional view in the manufacturing step of the semiconductor device continued from FIG. 23.

Next, as illustrated in FIG. 23, an insulating film 301 is formed on the organic insulating film 501 including the inside of the opening portion TH. As the insulating film 301, a silicon oxide film is formed by using the CVD method or others. Next, as illustrated in FIG. 24, by anisotropically etching the insulating film 301, the insulating film 301 is left only on the side wall of the opening portion TH. Thus, the insulating film 301 is removed from the bottom portion of the opening portion TH so that the pad electrode 200 is exposed. Note that, by patterning the insulating film 301, the insulating film 301 on the bottom portion of the opening portion TH and on the organic insulating film 501 may be removed therefrom so as to form the insulating film 301 covering the side wall of the opening portion TH.

Next, as illustrated in FIG. 25, a barrier metal film 601 is formed on the organic insulating film 501 including the inside of the opening portion TH. As the barrier metal film 601, for example, a TiN film is deposited by using a sputtering method or others so as to have a thickness of about 70 nm. Next, on the barrier metal film 601, a Cu film is deposited as a seed film (not illustrated) by the sputtering method so as to have a film thickness of about 100 nm. Then, a Cu film 701 is deposited on the upper portion of the seed film so as to have a thickness of about 3 μm by using an electrolytic plating method.

Next, the Cu film 701, the seed film and the barrier metal film 601 on the organic insulating film 501 are polished by using the CMP method. Thus, the bump electrode BP formed of the Cu film 701, the seed film and the barrier metal film 601 is formed inside the opening portion TH.

Next, for example, the second substrate Sb as explained in the second embodiment is prepared, and as illustrated in FIG. 26, the front surface of the second substrate Sb (which is the first surface, element surface, surface on the formation side of the bump electrode, surface on the formation side of the semiconductor element) and the rear surface of the first substrate Sa (which is the second surface, surface on the side opposite to the formation side of the semiconductor element) are faced and overlapped with each other, and then, these substrates are thermally compressed and bonded. At this time, electrical connection between the bump electrodes (BP, BPb) formed on the respective first substrate Sa and second substrate Sb and bonding between the organic insulating films (501, 500*b*) thereon are simultaneously performed.

Then, the rear surface of the second substrate Sb is subjected to a back grinding process so as to be a thin film whose substrate thickness is as about 25 μm. Moreover, the first substrate Sa and the second substrate Sb in a wafer state are cut along scribe lines to be individual pieces.

By performing the above processes, a semiconductor device of the present embodiment illustrated in FIG. 26 is completed.

Note that, in the above-described processes, the surface treatment on the organic insulating film 501 is performed subsequent to the formation of the opening portion TH but prior to the formation of the bump electrodes BP. However, the surface treatment on the organic insulating film 501 may be performed subsequent to the formation of the bump electrode BP but prior to the thermal compression-bonding between the substrates.

As described above, according to the present embodiment, the laminated insulating film TC of the inorganic insulating film 401 and the organic insulating film 501 is formed on the rear surface of the first substrate Sa, and therefore, the degassing from the organic insulating film 501 can be reduced in the heating and compression-bonding processes for the first substrate Sa and the second substrate Sb. Therefore, the occurrence of voids upon the compression-bonding process can be suppressed, and the peeling between the substrates due to bonding failure between the substrates can be reduced. Moreover, the connection failure between the bump electrodes can be reduced. In this manner, the characteristics of the semiconductor device can be improved.

Moreover, according to the present embodiment, the surface treatment is performed on the surface of the organic insulating film 501 prior to the thermal compression-bonding between the substrates, and therefore, the adhesive property between the organic insulating films (501, 500*b*) can be improved.

Fourth Embodiment

In a fourth embodiment, a bump electrode TBP on the rear surface side of the first substrate Sa (which is the second surface, surface on the side opposite to the formation side of the semiconductor element) is formed as a laminated structure formed of a first bump electrode 1BP and a second bump electrode 2BP.

Hereinafter, with reference to drawings, a structure and manufacturing steps of a semiconductor device of the present embodiment are explained. FIGS. 27 to 33 are cross-sectional views illustrating the manufacturing steps of the semiconductor device of the present embodiment.

[Explanation of Structure]

Figure 32:
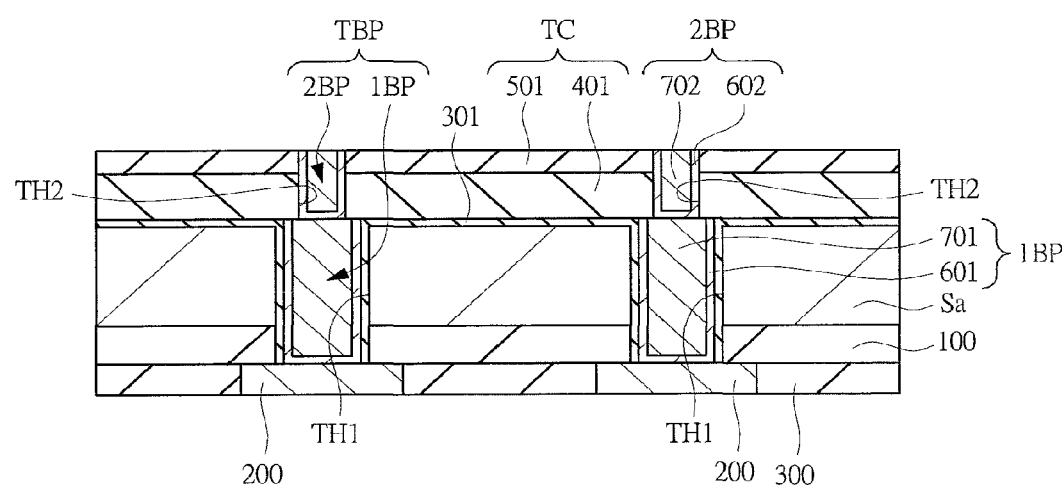
FIG. 32 is a cross-sectional view illustrating the manufacturing step of the semiconductor device of the fourth embodiment, which is a cross-sectional view in the manufacturing step of the semiconductor device continued from FIG. 31.

In FIG. 32 that is one of the cross-sectional views illustrating the manufacturing steps of the semiconductor device of the present embodiment, the rear surface of the first substrate Sa (which is the second surface, surface on the side opposite to the formation side of the semiconductor element) is illustrated as the upper side. Therefore, the formation layer 100 for the semiconductor element (which is the inner layer of the semiconductor element) formed in the front surface of the first substrate Sa (which is the first surface, element surface, surface on the formation side of the bump electrode, surface on the formation side of the semiconductor element) is positioned on the lower side of the first substrate Sa. Further below the formation layer 100 for the semiconductor element, the pad electrode (conductive film) 200 is arranged.

Moreover, on the rear surface of the first substrate Sa, a laminated insulating film TC of an inorganic insulating film 401 and an organic insulating film 501 is arranged. In this laminated insulating film TC, an opening portion (through hole) TH2 is formed. Inside the opening portion TH2, the second bump electrode 2BP is arranged. Further, on the first substrate Sa and the formation layer 100 for the semiconductor element, an opening portion (through hole) TH1 reaching the pad electrode 200 is formed. Inside the opening portion TH1, the first bump electrode 1BP is arranged. The first bump electrode 1BP and the second bump electrode 2BP are laminated so that the bump electrode TBP is formed.

Figure 33:
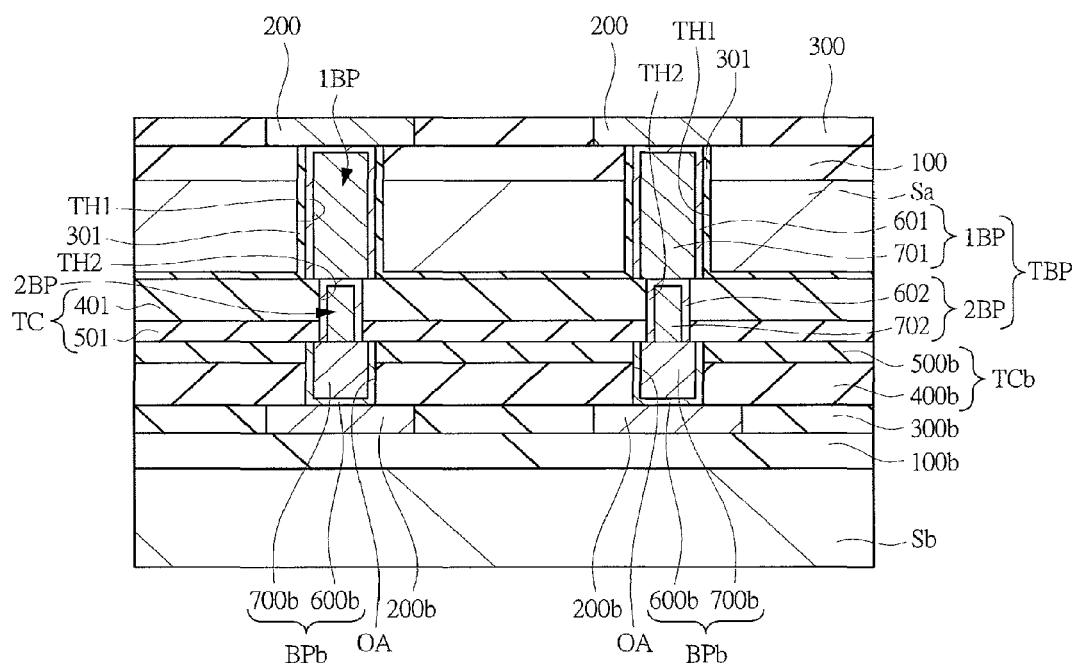
FIG. 33 is a cross-sectional view illustrating the manufacturing step of the semiconductor device of the fourth embodiment, which is a cross-sectional view in the manufacturing step of the semiconductor device continued from FIG. 32.

In the semiconductor of the present embodiment, as illustrated in FIG. 33, the rear surface side of the first substrate Sa and the front surface side of the second substrate Sb explained in the second embodiment are bonded to each other so that the organic insulating films (501 and 500*b*) are in contact with each other as well as the bump electrodes (TBP and BPb) are in contact with each other.

Also in the present embodiment, an opening portion TH2 that is opened by dry-etching the laminated insulating film TC of the inorganic insulating film 401 and the organic insulating film 501 is arranged in the upper portion of the pad electrode 200 (FIG. 32). Moreover, a surface treatment is performed on the organic insulating film 501.

[Explanation of Manufacturing Method]

Next, the manufacturing steps of the semiconductor device of the present embodiment are explained, and besides the structure of the semiconductor device of the present embodiment is further clarified.

Figure 27:
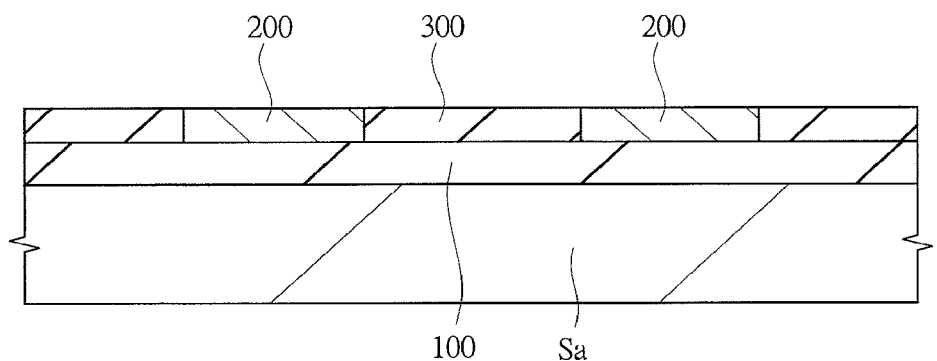
FIG. 27 is across-sectional view illustrating a manufacturing step of a semiconductor device of a fourth embodiment.

As illustrated in FIG. 27, the first substrate Sa having the formation layer 100 for the semiconductor element and the pad electrode 200 formed thereon is prepared. Note that the uppermost layer wire including the pad electrode 200 is formed by burying a metal film (for example, a Cu film) in the wiring trench inside the inorganic insulating film 300 as similar to the second embodiment.

Figure 28:
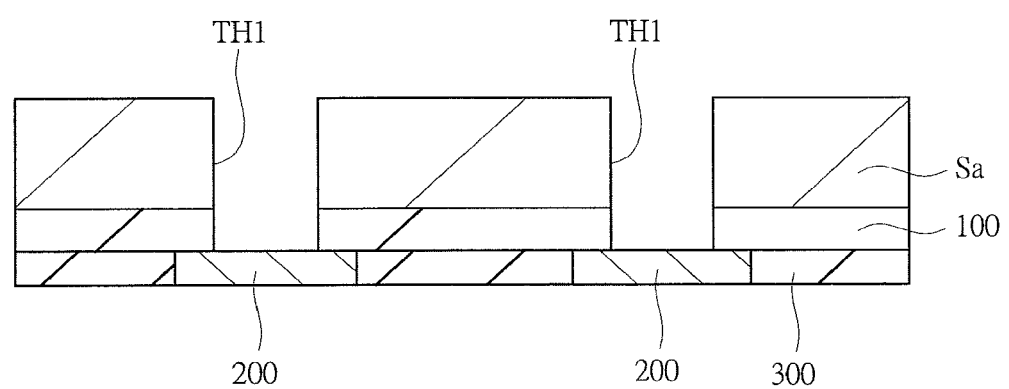
FIG. 28 is a cross-sectional view illustrating the manufacturing step of the semiconductor device of the fourth embodiment, which is a cross-sectional view in the manufacturing step of the semiconductor device continued from FIG. 27.

Next, the back grinding process is performed so that the thickness of the first substrate Sa is a predetermined thickness (for example, about 25 μm) when the rear surface of the first substrate Sa (which is the second surface, surface on the side opposite to the formation side of the semiconductor element) is set as the upper side. Next, as illustrated in FIG. 28, for example, by patterning the first substrate Sa and the formation layer 100 for the semiconductor element, an opening portion TH1 that penetrates through the first substrate Sa and the formation layer 100 for the semiconductor element and reaches the pad electrode 200 is formed. The formation region of the opening portion TH is laid out in association with the pad electrode 200, and is previously designed so that no semiconductor element is formed in this region.

Figure 29:
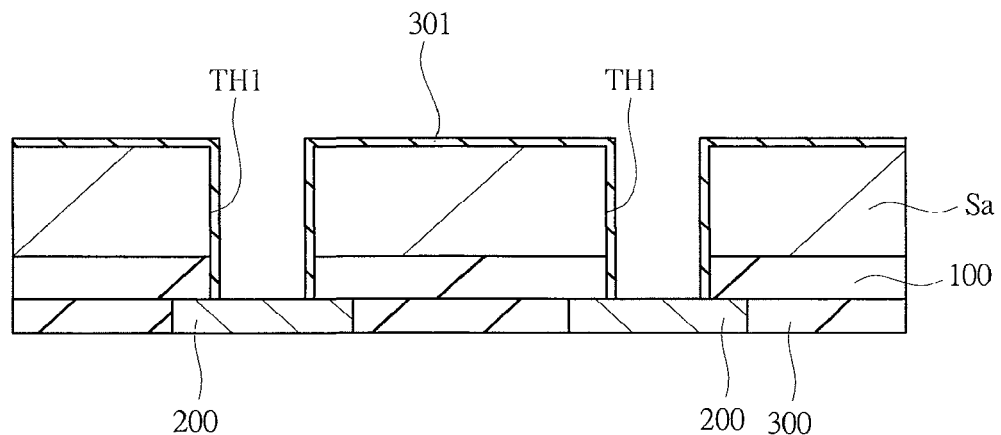
FIG. 29 is a cross-sectional view illustrating the manufacturing step of the semiconductor device of the fourth embodiment, which is a cross-sectional view in the manufacturing step of the semiconductor device continued from FIG. 28.

Next, as illustrated in FIG. 29, an insulating film 301 is formed on the first substrate Sa including the inside of the opening portion TH. As the insulating film 301, for example, a silicon oxide film is formed by using the CVD method or others. Next, by patterning the insulating film 301, the insulating film 301 on the bottom portion of the opening portion TH1 is removed.

Figure 30:
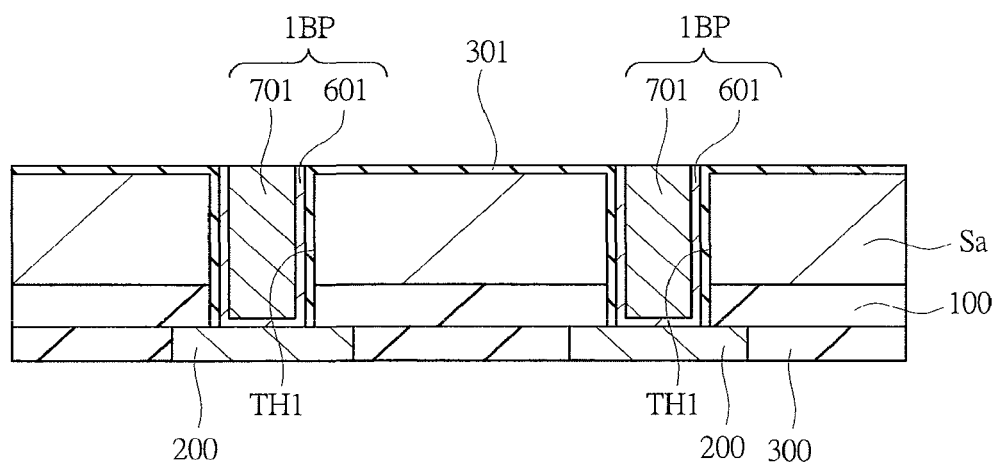
FIG. 30 is a cross-sectional view illustrating the manufacturing step of the semiconductor device of the fourth embodiment, which is a cross-sectional view in the manufacturing step of the semiconductor device continued from FIG. 29.

Next, as illustrated in FIG. 30, a barrier metal film 601, a seed film (not illustrated) and a Cu film 701 are formed on the insulating film 301 including the inside of the opening portion TH1 as similar to the third embodiment. Next, the Cu film 701, the seed film and the barrier metal film 601 on the insulating film 301 are polished by using the CMP method. Thus, a first bump electrode 1BP formed of the Cu film 701, the seed film and the barrier metal film 601 is formed inside the opening portion TH1.

Figure 31:
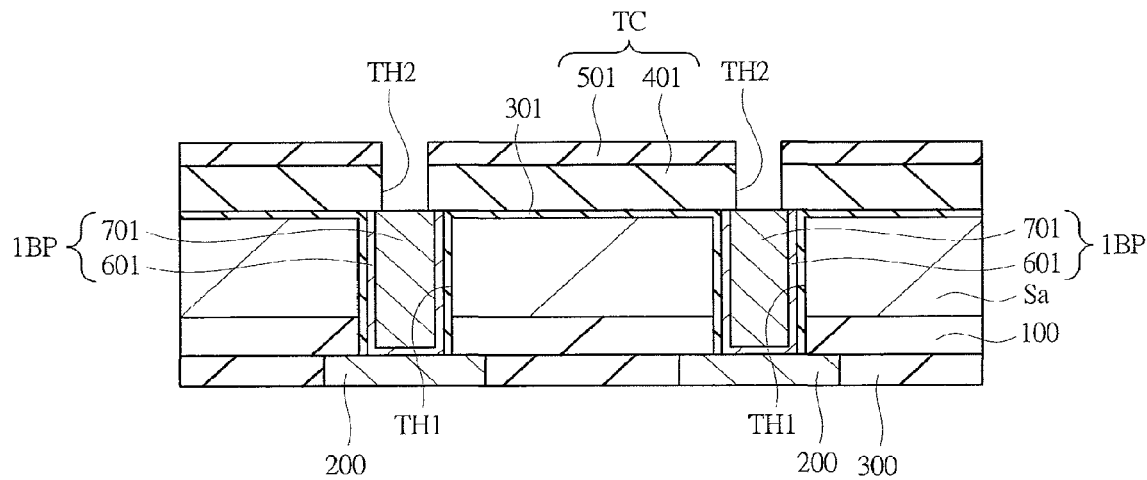
FIG. 31 is a cross-sectional view illustrating the manufacturing step of the semiconductor device of the fourth embodiment, which is a cross-sectional view in the manufacturing step of the semiconductor device continued from FIG. 30.

Next, as illustrated in FIG. 31, as the inorganic insulating film 401, for example, a silicon oxide film is deposited on the first bump electrode 1BP and the insulating film 301 by using the CVD method or others so as to have a thickness of about 500 nm. Then, on the inorganic insulating film 401, an organic insulating film 501 is formed. Here, a PBO film is formed as the inorganic insulating film 501 as similar to the first embodiment.

Next, by exposure and development processes, the organic insulating film 501 in the formation region of the opening portion TH2 is removed. Then, the inorganic insulating film 401 is dry-etched with using the organic insulating film 501 as a mask. Thus, the opening portion TH2 that penetrates through the inorganic insulating film 401 and the organic insulating film 501 and reaches the first bump electrode 1BP is formed.

Next, a surface treatment is performed on the surface of the organic insulating film 501 (which is the rear surface of the first substrate Sa). As the surface treatment, for example, gas containing hydrogen radicals is sprayed onto the surface of the organic insulating film 501. Thus, the surface of the organic insulating film 501 is modified.

Next, as illustrated in FIG. 32, as a barrier metal film 602, for example, a TiN film is deposited on the organic insulating film 501 including the inside of the opening portion TH2 by using the sputtering method or others. Then, a Cu film is deposited as a seed film (not illustrated) on the barrier metal film 602 by the sputtering method. Next, a Cu film 702 is deposited on the upper portion of the seed film by the electrolytic plating method.

Next, the Cu film 702, the seed film and the barrier metal film 602 on the organic insulating film 501 are polished by using the CMP method. Thus, a second bump electrode 2BP formed of the Cu film 702, the seed film and the barrier metal film 602 is formed inside the opening portion TH2.

By the above-described processes, the bump electrode TBP is formed so as to be connected to the pad electrode 200, be formed by the laminated structure of the first bump electrode 1BP and the second bump electrode 2BP, and be exposed from the rear surface of the first substrate Sa (which is the second surface, surface on the side opposite to the formation side of the semiconductor element).

Next, for example, the second substrate Sb as explained in the second embodiment is prepared, and the front surface of the second substrate Sb (which is the first surface, element surface, surface on the formation side of the bump electrode, surface on the formation side of the semiconductor element) and the rear surface of the first substrate Sa (which is the second surface, surface on the side opposite to the formation side of the semiconductor element) are faced and overlapped with each other as illustrated in FIG. 33, and then, these substrates are thermally compressed and bonded. At this time, electrical connection between the bump electrodes (TBP, BPb) formed on the respective first substrate Sa and second substrate Sb and bonding between the organic insulating films (501, 500b) thereon are simultaneously performed.

Then, the rear surface of the second substrate Sb is subjected to the back grinding process so as to be a thin film whose substrate thickness is about 25 μm. Moreover, the first substrate Sa and the second substrate Sb in a wafer state are cut along scribe lines to be individual pieces.

By performing the above processes, a semiconductor device of the present embodiment illustrated in FIG. 33 is completed.

Note that, in the above-described processes, the surface treatment on the organic insulating film 501 is performed subsequent to the formation of the opening portion TH2 but prior to the formation of the bump electrode TBP. However, the surface treatment on the organic insulating film 501 may be performed subsequent to the formation of the bump electrode TBP but prior to the thermal compression-bonding between the substrates.

As described above, according to the present embodiment, the laminated insulating film TC of the inorganic insulating film 401 and the organic insulating film 501 is formed on the rear surface of the first substrate Sa, and therefore, the degassing from the organic insulating film 501 can be reduced in the heating and compression-bonding processes for the first substrate Sa and the second substrate Sb. Therefore, the occurrence of voids at the time of the compression-bonding process can be suppressed, and the peeling between the substrates due to bonding failure between the substrates can be reduced. Moreover, the connection failure between the bump electrodes can be reduced. In this manner, the characteristics of the semiconductor device can be improved.

According to the present embodiment, the surface treatment is performed on the surface of the organic insulating film 501 prior to the thermal compression-bonding process between the substrates, and therefore, the adhesive property between the organic insulating films (501, 500b) can be improved.

Fifth Embodiment

In a fifth embodiment, the first bump electrode 1BP of the bump electrode TBP having the laminated structure of the first bump electrode 1BP and the second bump electrode 2BP is formed prior to the formation of the pad electrode (conductive film) 200.

With reference to drawings, a structure and manufacturing steps of a semiconductor device of the present embodiment are explained. FIGS. 34 to 44 are cross-sectional views illustrating the manufacturing steps of the semiconductor device of the present embodiment.

[Explanation of Structure]

Figure 43:
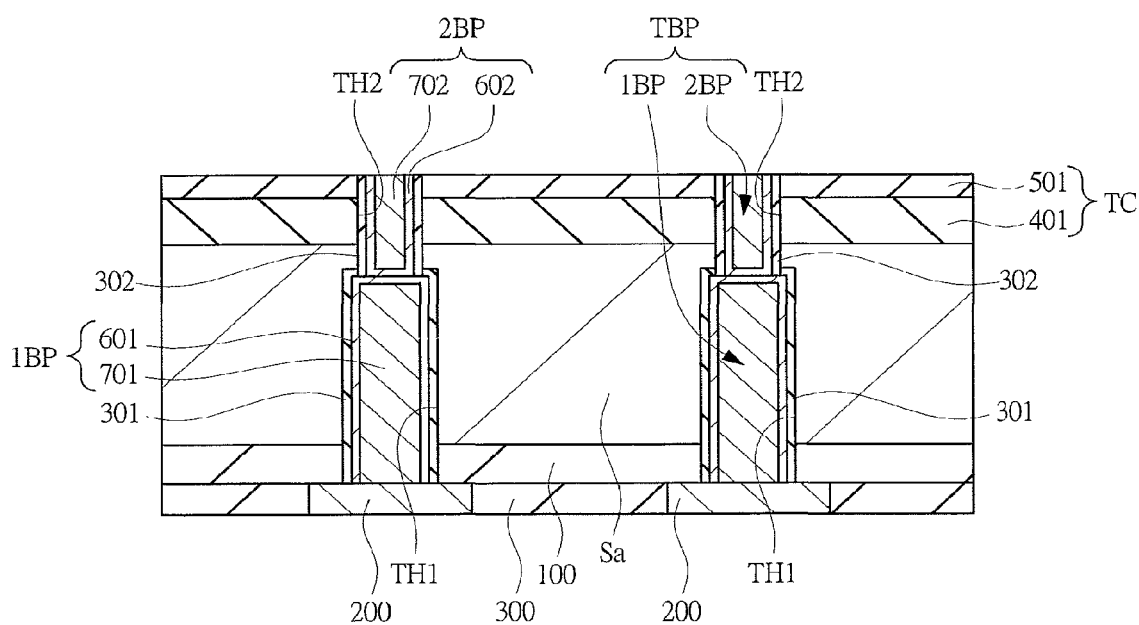
FIG. 43 is a cross-sectional view illustrating the manufacturing step of the semiconductor device of the fifth embodiment, which is a cross-sectional view in the manufacturing step of the semiconductor device continued from FIG. 42.

In FIG. 43 that is one of the cross-sectional views illustrating the manufacturing steps of the semiconductor device of the present embodiment, the rear surface of the first substrate Sa (which is the second surface, surface on the side opposite to the formation side of semiconductor elements) is illustrated as the upper side. Therefore, the formation layer 100 for the semiconductor element (which is the inner layer of the semiconductor element) formed in the front surface of the first substrate Sa (which is the first surface, element surface, surface on the formation side of the bump electrode, surface on the formation side of the semiconductor element) is positioned on the lower side of the first substrate Sa. Further below the formation layer 100 for the semiconductor element, the pad electrode (conductive film) 200 is arranged.

Moreover, on the rear surface of the first substrate Sa, a laminated insulating film TC of an inorganic insulating film 401 and an organic insulating film 501 is arranged. In a part of the laminated insulating film IC and the first substrate Sa, an opening portion TH2 is provided. The side wall of this opening portion TH2 is covered with an insulating film 302, and besides, a second bump electrode 2BP is arranged inside the opening portion TH2. Further, an opening portion TH1 is formed in the first substrate Sa and the formation layer 100 for the semiconductor element. Inside this opening portion TH1, a first bump electrode 1BP is arranged. A bump electrode TBP is constituted by a laminate of these first bump electrode 1BP and second bump electrode 2BP.

Figure 44:
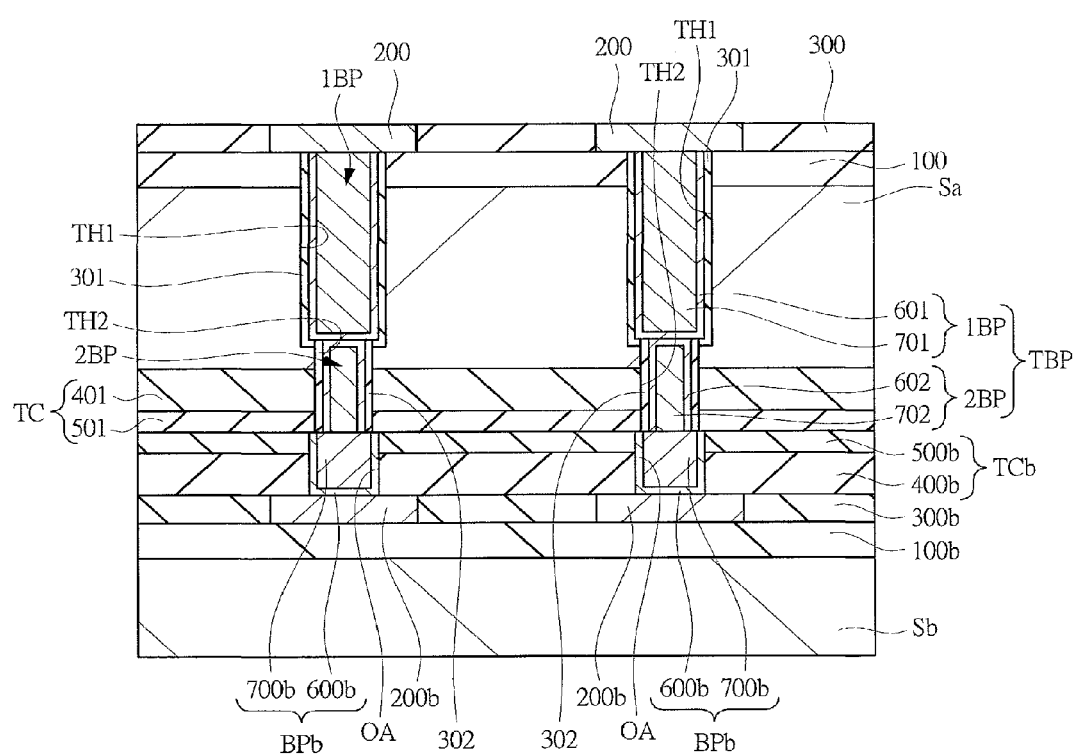
FIG. 44 is a cross-sectional view illustrating the manufacturing step of the semiconductor device of the fifth embodiment, which is a cross-sectional view in the manufacturing step of the semiconductor device continued from FIG. 43.

In the semiconductor of the present embodiment, as illustrated in FIG. 44, the rear surface side of the first substrate Sa and the front surface side of the second substrate Sb explained in the second embodiment are bonded to each other so that the organic insulating films (501 and 500*b*) are in contact with each other as well as the bump electrodes (TBP and BPb) are in contact with each other.

Also in the present embodiment, an opening portion TH2 that is opened by dry-etching the laminated insulating film TC of the inorganic insulating film 401 and the organic insulating film 501 or others is arranged in the upper portion of the pad electrode 200 (FIG. 43). Moreover, a surface treatment is performed on the organic insulating film 501.

[Explanation of Manufacturing Method]

Next, the manufacturing steps of the semiconductor device of the present embodiment are explained, and besides, the structure of the semiconductor device of the present embodiment is further clarified.

Figure 34:
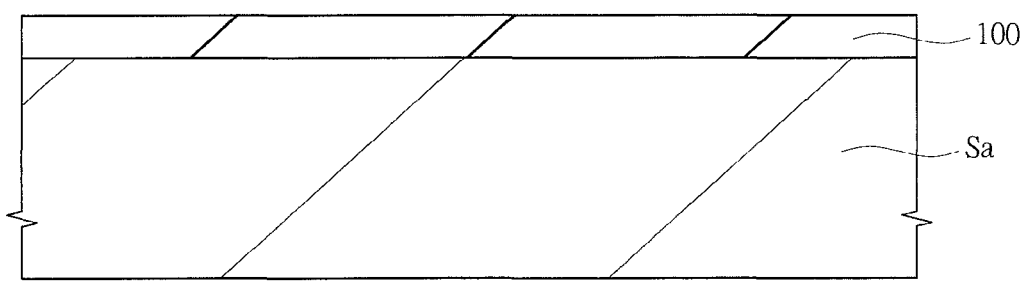
FIG. 34 is a cross-sectional view illustrating a manufacturing step of a semiconductor device of a fifth embodiment.
Figure 35:
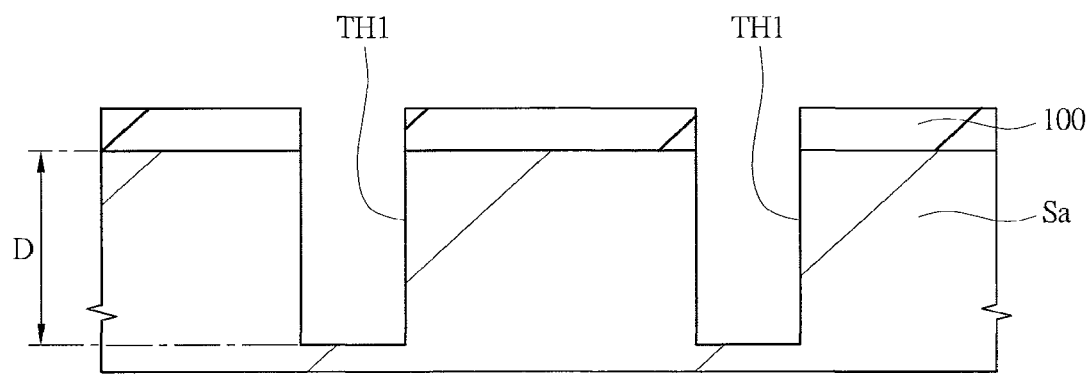
FIG. 35 is a cross-sectional view illustrating the manufacturing step of the semiconductor device of the fifth embodiment, which is a cross-sectional view in the manufacturing step of the semiconductor device continued from FIG. 34.

As illustrated in FIG. 34, the first substrate Sa having the formation layer 100 for the semiconductor element formed thereon is prepared. Next, as illustrated in FIG. 35, by patterning the formation layer 100 for the semiconductor element and the first substrate Sa in a formation region where the pad electrode 200 is to be formed, an opening portion (concave portion) TH1 is formed. At this time, the bottom portion of the opening portion TH1 is located at a position having a distance D from the surface of the first substrate Sa. In other words, the opening portion TH1 is formed by etching the formation layer 100 for the semiconductor element, and then, further etching the first substrate Sa to the depth of the distance D.

Figure 36:
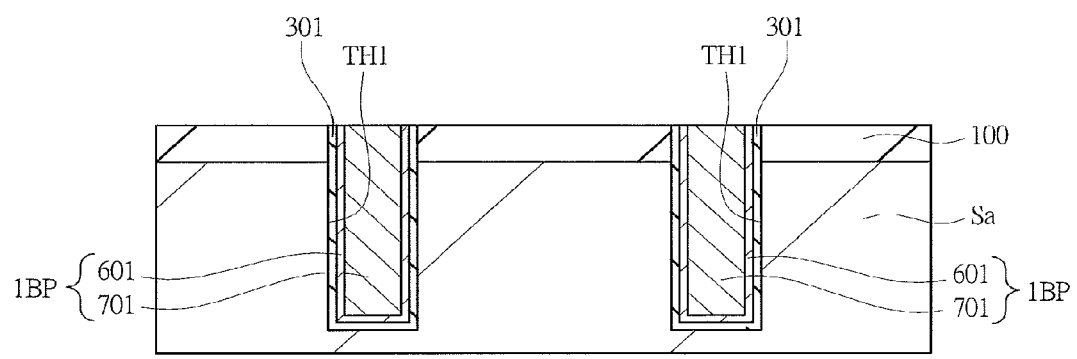
FIG. 36 is a cross-sectional view illustrating the manufacturing step of the semiconductor device of the fifth embodiment, which is a cross-sectional view in the manufacturing step of the semiconductor device continued from FIG. 35.

Next, as illustrated in FIG. 36, an insulating film 301 is formed on the first substrate Sa including the inside of the opening portion TH1. As the insulating film 301, a silicon oxide film is formed by the CVD method or others. Next, by patterning the insulating film 301, the insulating film 301 on the first substrate Sa is removed.

Next, on the first substrate Sa including the inside of the opening portion TH1, for example, a TiN film is deposited as a barrier metal film 601 by using the sputtering method or others. Next, a Cu film is deposited as a seed film (not illustrated) on the barrier metal film 601 by the sputtering method. Next, a Cu film 701 is deposited on the upper portion of the seed film by the electrolytic plating method.

Next, the Cu film 701, the seed film and the barrier metal film 601 on the formation layer 100 for the semiconductor element are polished by using the CMP method. Thus, a first bump electrode 1BP formed of the Cu film 701, the seed film and the barrier metal film 601 is formed inside the opening portion TH1.

Here, the formation region of the opening portion TH1 is laid out in association with the formation region where the pad electrode 200 is to be formed, and is previously designed so that no semiconductor element is formed in this region.

Figure 37:
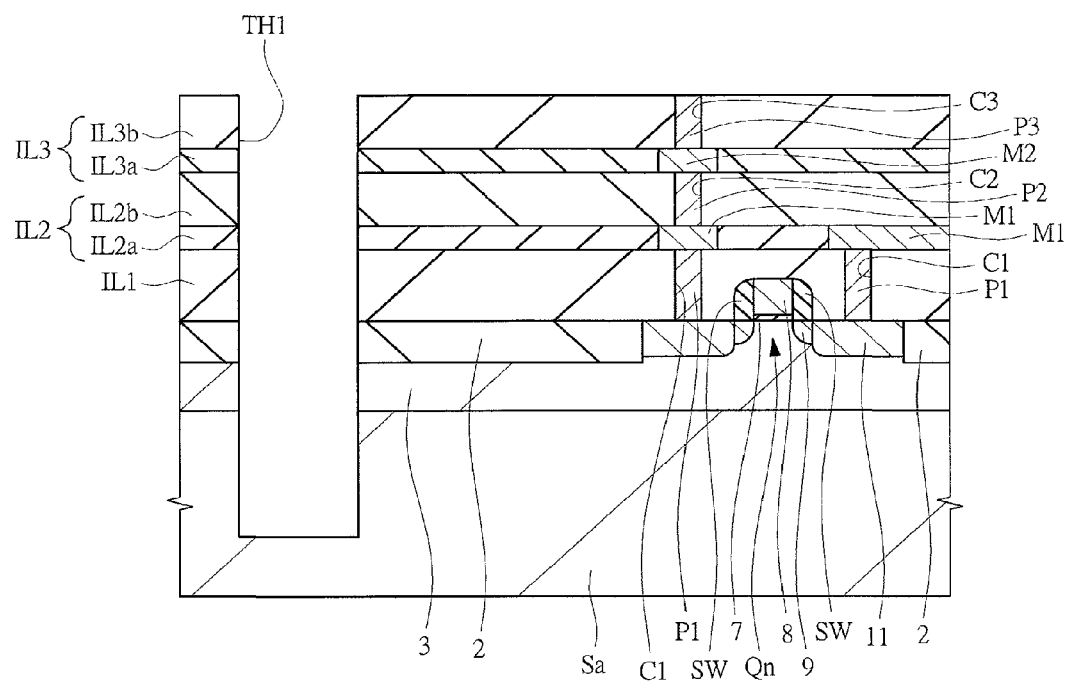
FIG. 37 is another cross-sectional view illustrating the manufacturing step of the semiconductor device of the fifth embodiment.

The element to be formed in the formation layer 100 for the semiconductor element is not limited, and a MISFET or others can be formed as similar to the first embodiment or others. FIG. 37 illustrates one example thereof. As illustrated in FIG. 37, an MISFET (Qn) is formed on the first substrate Sa. In an interlayer insulating film IL1 on the MISFET (Qn), a plug P1 is formed. On the interlayer insulating film IL1, a wire M1 buried in a wire-trench insulating film IL2*a* is formed. an interlayer insulating film IL2*b* is formed on the wire M1, and a plug P2 is formed in the interlayer insulating film IL2*b*. Moreover, on the interlayer insulating film IL2*b*, a wire M2 buried in a wire-trench insulating film IL3*a* is formed. An interlayer insulating film IL3*b* is formed on the wire M2, and a plug P3 is formed in the interlayer insulating film IL3*b*.

On the interlayer insulating film IL3*b*, a wire M3 corresponding to the uppermost layer wire is formed. In the present embodiment, prior to the formation of the uppermost layer wire (wire M3), an opening portion TH1 is formed by etching the formation layer 100 for the semiconductor element and the first substrate Sa (FIG. 37). More specifically, the opening portion TH1 is formed by etching a part of the interlayer insulating film IL3*b*, the wire-trench insulating film IL3*a*, the interlayer insulating film IL2*b*, the wire-trench insulating film IL2*a*, the interlayer insulating film IL1, the element isolation region 2, and the first substrate Sa.

Figure 38:
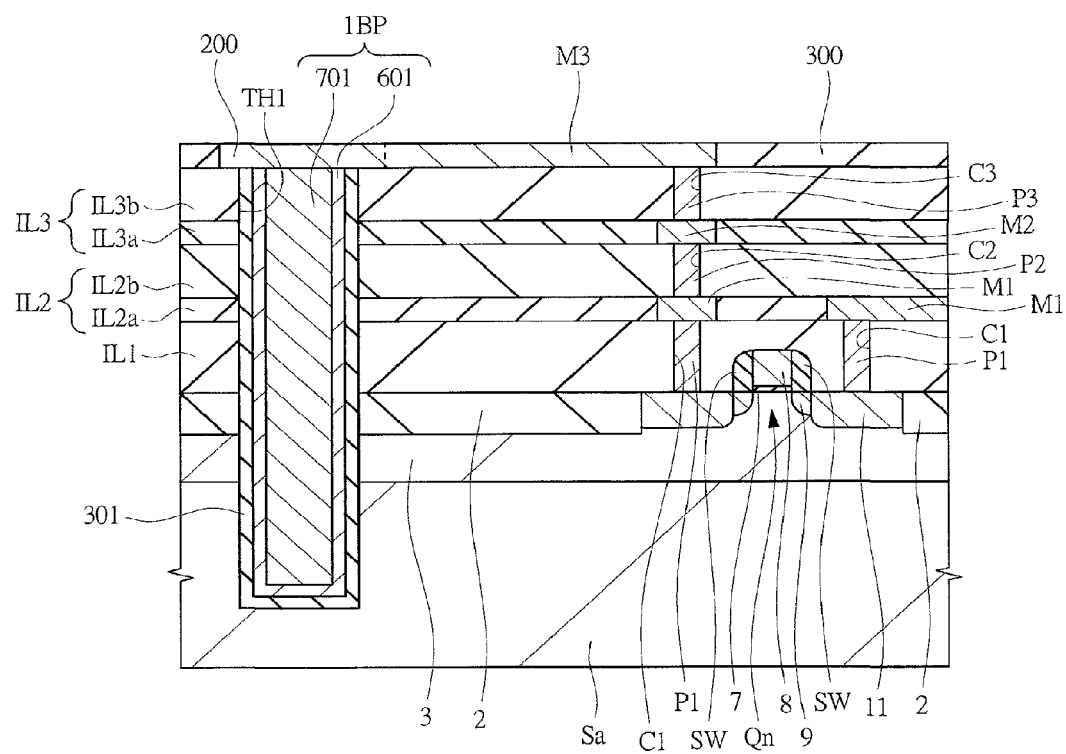
FIG. 38 is still another cross-sectional view illustrating the manufacturing step of the semiconductor device of the fifth embodiment.

Then, as illustrated in FIG. 38, an insulating film 301 is formed so as to cover the bottom portion and the side wall of the opening portion TH1. Next, a first bump 1BP formed of the Cu film 701, the seed film and the barrier metal film 601 is formed inside the opening portion TH1, and the uppermost layer wire (wire M3 in FIG. 38) is formed so that the pad electrode 200 is positioned on the first bump electrode 1BP. For example, a silicon oxide film is deposited on the upper portion of the first substrate Sa as the inorganic insulating film 300 by the CVD method or others. By patterning the inorganic insulating film 300, a wire trench is formed, and a metal film (for example, Cu film) is buried therein, so that the uppermost layer wire (wire M3 in FIG. 38) is formed. A part of the uppermost layer wire (wire M3 in FIG. 38) becomes the pad electrode 200.

In this manner, in the present embodiment, the pad electrode 200 (uppermost layer wire) is formed subsequent to the formation of the opening portion TH1 and the first bump electrode 1BP.

Figure 39:
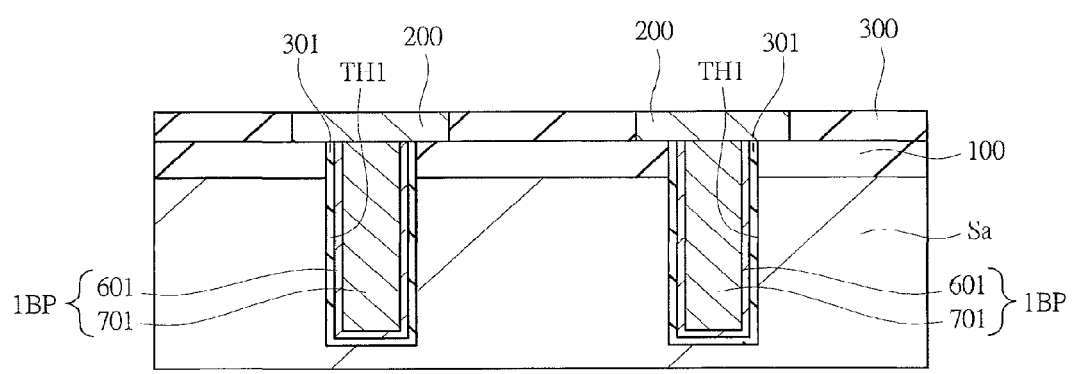
FIG. 39 is a cross-sectional view illustrating the manufacturing step of the semiconductor device of the fifth embodiment, which is a cross-sectional view in the manufacturing step of the semiconductor device continued from FIG. 36.

FIG. 39 illustrates the formation layer (inner layer of semiconductor element) as a reference numeral 100 so that the pad electrode 200 is on the first bump electrode 1BP.

Figure 40:
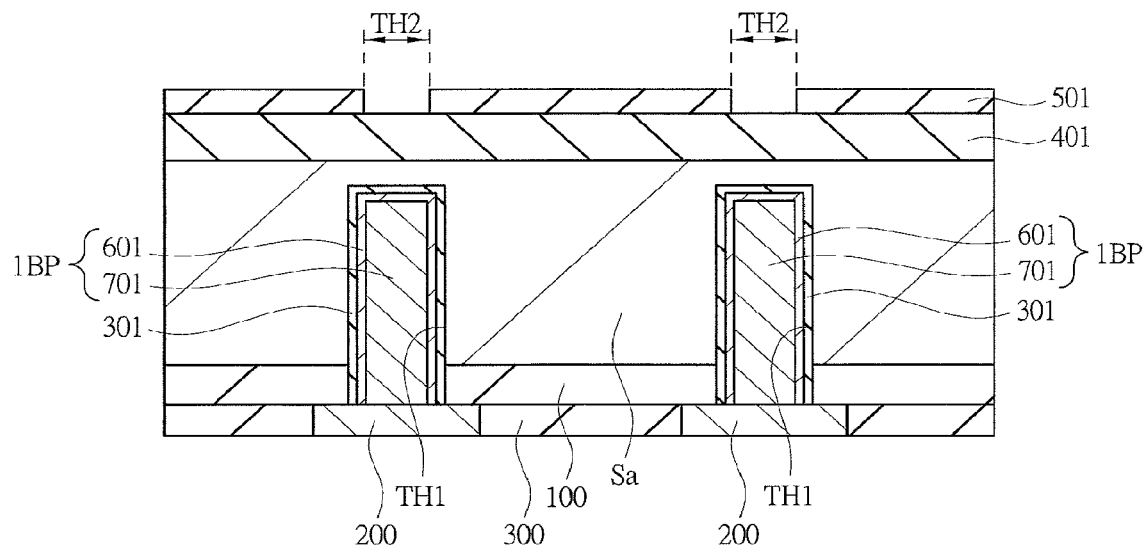
FIG. 40 is a cross-sectional view illustrating the manufacturing step of the semiconductor device of the fifth embodiment, which is a cross-sectional view in the manufacturing step of the semiconductor device continued from FIG. 39.

Then, a back grinding process is performed so that the thickness of the first substrate Sa is a predetermined thickness (for example, about 25 μm) when the rear surface of the first substrate Sa is set as the upper side. Here, the amount of back grinding is adjusted so that the first substrate Sa remains on the first bump electrode 1BP (FIG. 40).

Next, for example, a silicon oxide film is deposited on the first substrate Sa as an inorganic insulating film 401 by the CVD method or others so as to have a thickness of about 500 nm. Next, on the inorganic insulating film 401, an organic insulating film 501 is formed. Here, as the organic insulating film 501, a PBO film is formed as similar to the first embodiment.

Figure 41:
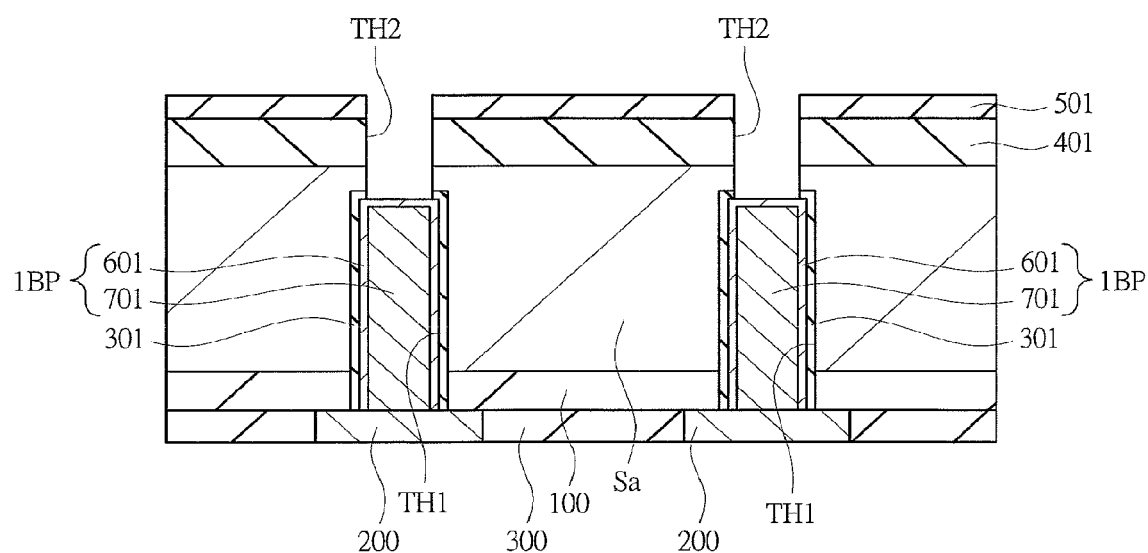
FIG. 41 is a cross-sectional view illustrating the manufacturing step of the semiconductor device of the fifth embodiment, which is a cross-sectional view in the manufacturing step of the semiconductor device continued from FIG. 40.

Next, as illustrated in FIG. 41, by exposure and development processes, the organic insulating film 501 in the formation region of the opening portion TH2 is removed. Then, the inorganic insulating film 401, the first substrate Sa and the insulating film 301 are etched with using the organic insulating film 501 as a mask. Thus, the opening portion TH2, which reaches the first bump electrode 1BP, is formed.

Next, a surface treatment is performed on the surface (rear surface of the first substrate Sa) of the organic insulating film 501. As the surface treatment, for example, gas containing hydrogen radicals is sprayed onto the surface of the organic insulating film 501. Thus, the surface of the organic insulating film 501 is modified.

Figure 42:
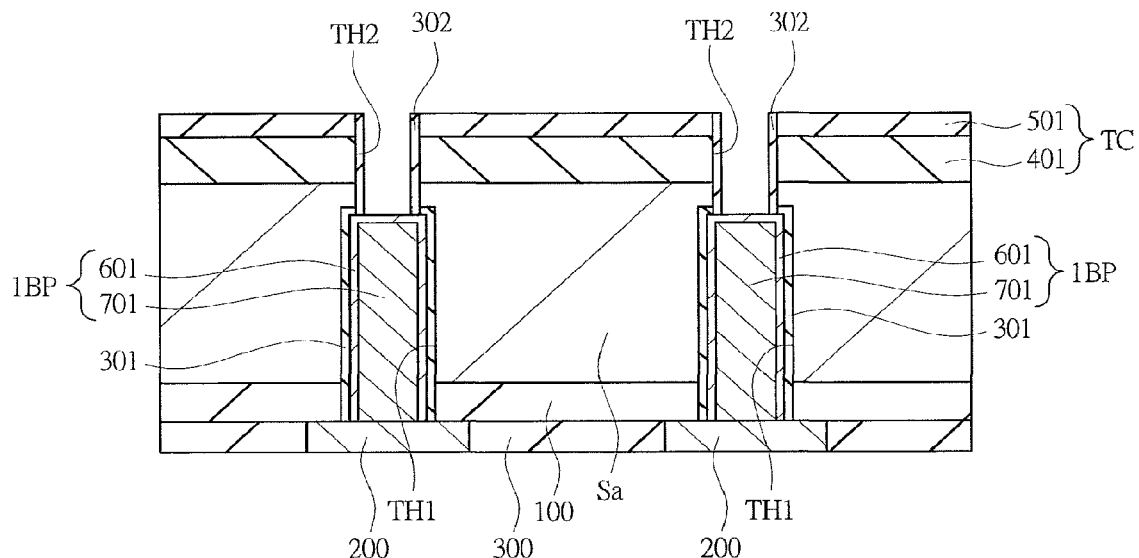
FIG. 42 is a cross-sectional view illustrating the manufacturing step of the semiconductor device of the fifth embodiment, which is a cross-sectional view in the manufacturing step of the semiconductor device continued from FIG. 41.

Next, as illustrated in FIG. 42, an insulating film 302 is formed on the organic insulating film 501 including the inside of the opening portion TH2. As the insulating film 302, for example, a silicon oxide film is formed by using the CVD method or others. Then, by anisotropically etching the insulating film 302, the insulating film 302 is left only on the side wall of the opening portion TH2.

Next, as illustrated in FIG. 43, as a barrier metal film 602, for example, a TiN film is deposited by using the sputtering method or others. Then, a Cu film is deposited on the barrier metal film 602 as a seed film (not illustrated) by the sputtering method. Next, a Cu film 702 is deposited on the upper portion of the seed film by the electrolytic plating method.

Next, the Cu film 702, the seed film and the barrier metal film 602 on the organic insulating film 501 are polished by using the CMP method. Thus, a second bump electrode 2BP formed of the Cu film 702, the seed film and the barrier metal film 602 is formed inside each opening portion TH2.

By the above-described processes, the bump electrode TBP is formed so as to be connected to the pad electrode 200, to be formed of the laminated structure of the first bump electrode 1BP and the second bump electrode 2BP, and to be exposed from the rear surface of the first substrate Sa (which is the second surface, surface on the side opposite to the formation side of the semiconductor element).

Next, for example, the second substrate Sb as explained in the second embodiment is prepared, and as illustrated in FIG. 44, the front surface of the second substrate Sb (which is the first surface, element surface, surface on the formation side of the bump electrode, surface on the formation side of the semiconductor element) and the rear surface of the first substrate Sa (which is second surface, surface on the side opposite to the formation side of the semiconductor element) are faced and overlapped with each other, and these substrates are thermally compressed and bonded. At this time, electrical connection between the bump electrodes (TBP, BPb) formed on the respective first substrate Sa and second substrate Sb and bonding between the organic insulating films (501, 500b) thereon are simultaneously performed.

Then, the rear surface of the second substrate Sb is subjected to a back grinding process so as to be a thin film whose substrate thickness is about 25 µm. Moreover, the first substrate Sa and the second substrate Sb in a wafer state are cut along scribe lines to be individual pieces.

By performing the above processes, a semiconductor device of the present embodiment illustrated in FIG. 44 is completed.

Note that, in the above-described processes, the surface treatment on the organic insulating film 501 is performed subsequent to the formation of the opening portion TH2 but prior to the formation of the second bump electrode 2BP. However, the surface treatment on the organic insulating film 501 may be performed subsequent to the formation of the second bump electrode 2BP but prior to the thermal compression-bonding between the substrates.

As described above, according to the present embodiment, the laminated insulating film TC of the inorganic insulating film 401 and the organic insulating film 501 is formed on the rear surface of the first substrate Sa, and therefore, the degassing from the organic insulating film 501 can be reduced in the heating and compression-bonding processes for the first substrate Sa and the second substrate Sb. Therefore, the occurrence of voids at the time of the compression-bonding process can be suppressed, the peeling between the substrates due to bonding failure between the substrates can be reduced. Moreover, the connection failure between the bump electrodes can be reduced. In this manner, the characteristics of the semiconductor device can be improved.

According to the present embodiment, the surface treatment is performed on the surface of the organic insulating film 501 prior to the thermal compression-bonding between the substrates, and therefore, the adhesive property of the organic insulating film 501 can be improved.

Sixth Embodiment

Figure 45:
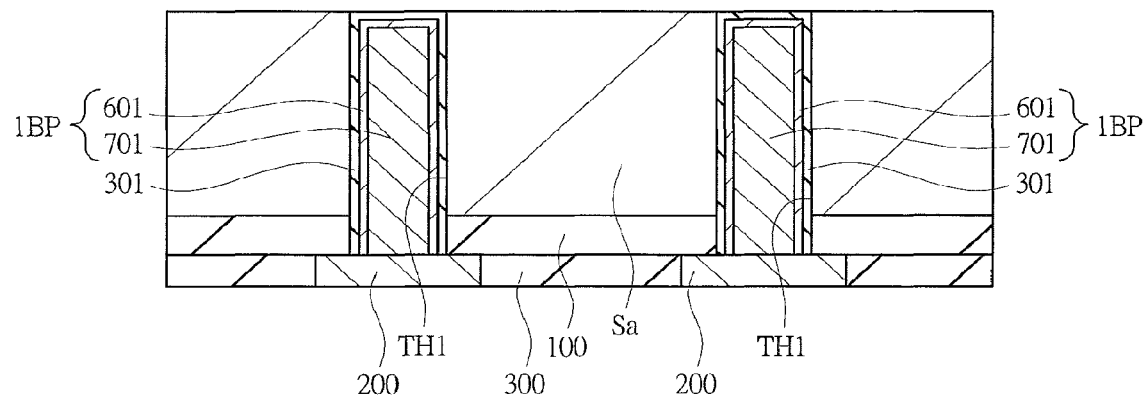
FIG. 45 is a cross-sectional view illustrating a manufacturing step of a semiconductor device of a sixth embodiment.
Figure 46:
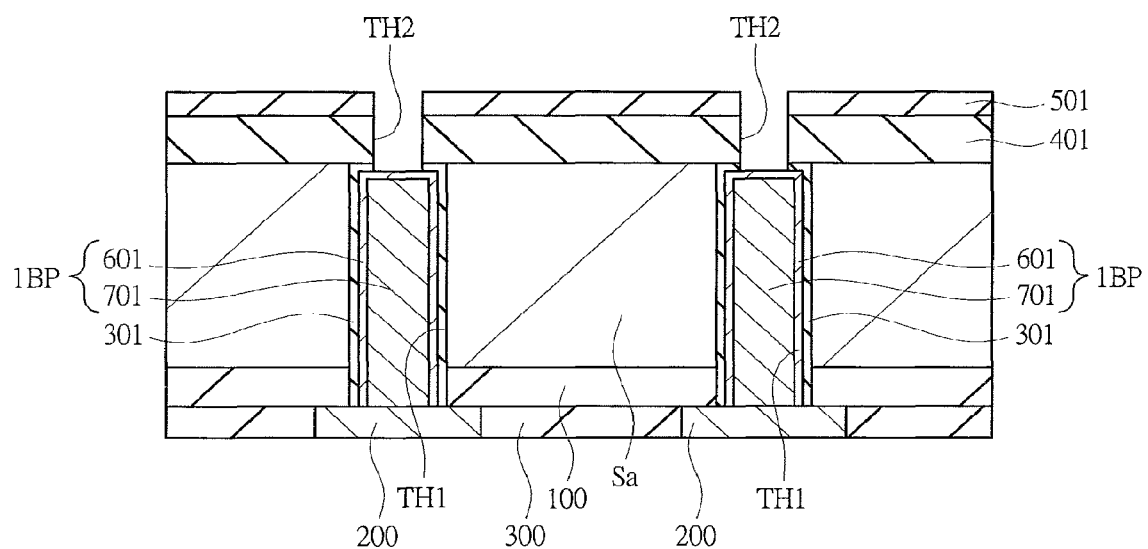
FIG. 46 is a cross-sectional view illustrating the manufacturing step of the semiconductor device of the sixth embodiment, which is a cross-sectional view in the manufacturing step of the semiconductor device continued from FIG. 45.
Figure 47:
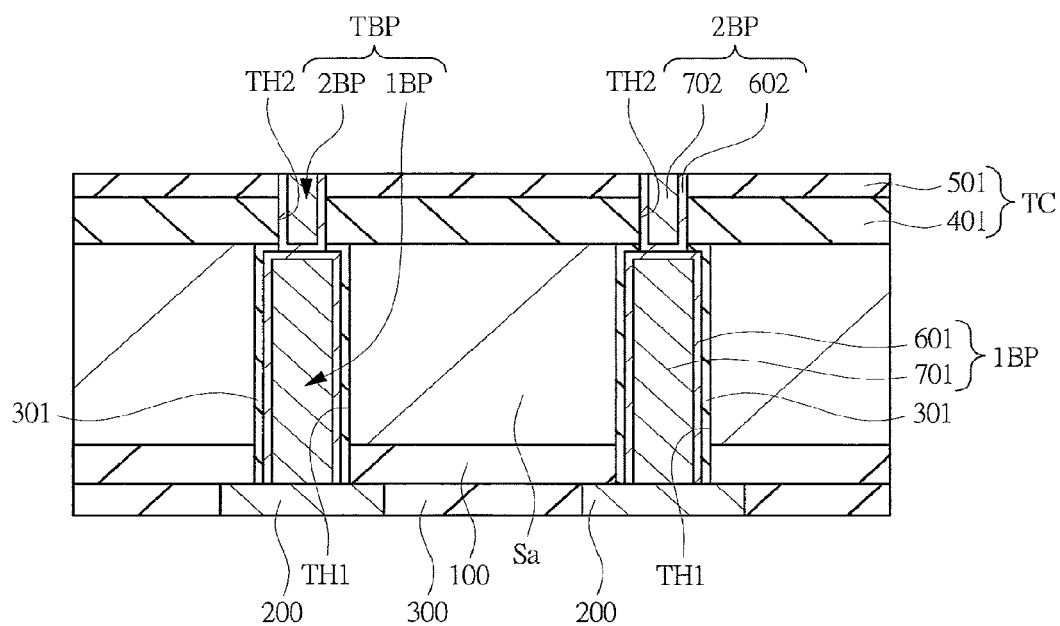
FIG. 47 is a cross-sectional view illustrating the manufacturing step of the semiconductor device of the sixth embodiment, which is a cross-sectional view in the manufacturing step of the semiconductor device continued from FIG. 46.

In the fifth embodiment, the back grinding amount is adjusted so that the first substrate Sa is left on the first bump electrode 1BP (FIG. 40). However, the first substrate Sa may be subjected to the back grinding process until the first bump electrode 1BP is exposed. FIGS. 45 to 47 are cross-sectional views illustrating the manufacturing steps of the semiconductor device of a sixth embodiment.

[Explanation of Structure]

In FIG. 47 that is one of the cross-sectional views illustrating the manufacturing steps of the semiconductor device of the present embodiment, the rear surface of the first substrate Sa (which is the second surface, surface on the side opposite to the formation side of the semiconductor element) is illustrated as the upper side. Therefore, the formation layer 100 for the semiconductor element (which is the inner layer of the semiconductor element) formed on the front surface of the first substrate Sa (which is the first surface, element surface, surface on the formation side of the bump electrode, surface on the formation side of the semiconductor element) is positioned on the lower side of the first substrate Sa. Further below the formation layer 100 for the semiconductor element, the pad electrode (conductive film) 200 is arranged.

Moreover, on the rear surface of the first substrate Sa, a laminated insulating film TC of an inorganic insulating film 401 and an organic insulating film 501 is arranged. An opening portion TH2 is formed in the laminated insulating film IC, and a second bump electrode 2BP is arranged inside the opening portion TH2. Moreover, in the first substrate Sa and the formation layer 100 for the semiconductor element, an opening portion TH1 that reaches the pad electrode 200 is formed. Inside the opening portion TH1, a first bump electrode 1BP is arranged. A bump electrode TBP is formed by a laminate of the first bump electrode 1BP and second bump electrode 2BP.

Also in the present embodiment, the opening portion TH2, which is opened by dry-etching the laminated insulating film TC of the inorganic insulating film 401 and the organic insulating film 501 or others, is formed on the upper portion of the pad electrode 200 (FIG. 47). Moreover, a surface treatment is performed on the organic insulating film 501.

[Explanation of Manufacturing Method]

Next, the manufacturing steps of the semiconductor device of the present embodiment are explained, and besides, the structure of the semiconductor device of the present embodiment is further clarified.

As similar to the fifth embodiment, on the first substrate Sa, the opening portion (concave portion) TH1, the insulating film 301 and the first bump electrode 1BP are formed, and an uppermost layer wire (pad electrode 200) is further formed thereon (see FIG. 39).

Then, a back grinding process is performed so that the thickness of the first substrate Sa is a predetermined thickness (for example, about 25 µm) when the rear surface of the first substrate Sa is set as the upper side. Here, the first substrate Sa is subjected to the back grinding process until the insulating film 301 on the first bump electrode 1BP is exposed (FIG. 45).

Next, for example, a silicon oxide film is deposited on the first substrate Sa and the first bump electrode 1BP (insulating film 301) as an inorganic insulating film 401 by the CVD method or others. Next, on the inorganic insulating film 401, an organic insulating film 501 is formed. Here, as the organic insulating film 501, a PBO film is formed as similar to the first embodiment. Note that the insulating film 301 may be removed by the back grinding process so that the first bump electrode 1BP is exposed.

Next, as illustrated in FIG. 46, by performing exposure and development processes, the organic insulating film 501 in the formation region of the opening portion TH2 is removed. Then, the inorganic insulating film 401 and the insulating film 301 are etched with using the organic insulating film 501 as a mask. Thus, the opening portion TH2, which reaches the first bump electrode 1BP, is formed.

Next, a surface treatment is performed on the surface (rear surface of the first substrate Sa) of the organic insulating film 501. As the surface treatment, for example, gas containing hydrogen radicals is sprayed onto the surface of the organic insulating film 501. Thus, the surface of the organic insulating film 501 is modified.

Next, as illustrated in FIG. 47, as a barrier metal film 602, for example, a TiN film is deposited on the organic insulating film 501 including the inside of the opening portion TH2 by using the sputtering method or others. Then, a Cu film is deposited on the barrier metal film 602 as a seed film (not illustrated) by the sputtering method. Next, a Cu film 702 is deposited on the upper portion of the seed film by the electrolytic plating method.

Next, the Cu film 702, the seed film and the barrier metal film 602 on the organic insulating film 501 are polished by using the CMP method. Thus, a second bump electrode 2BP formed of the Cu film 702, the seed film and the barrier metal film 602 is formed inside each opening portion TH2.

By the above-described processes, the bump electrode TBP is formed so as to be connected to the pad electrode 200, to be formed by a laminated structure of the first bump electrode 1BP and the second bump electrode 2BP, and to be exposed from the rear surface of the first substrate Sa (which is the second surface, surface on the side opposite to the formation side of the semiconductor element).

Next, for example, the second substrate Sb as explained in the second embodiment is prepared, and the front surface of the second substrate Sb (first surface, element surface, surface on the formation side of the bump electrode, surface on the formation side of the semiconductor element) and the rear surface of the first substrate Sa (second surface, surface on the side opposite to the formation side of the semiconductor element) are faced and overlapped with each other, and after having been overlapped with each other as similar to the fifth embodiment, and these substrates are thermally compressed and bonded (see FIG. 44). At this time, electrical connection between the bump electrodes (TBP, BPb) formed on the respective first substrate Sa and second substrate Sb and bonding between the organic insulating films (501, 500b) are simultaneously performed.

Then, the rear surface of the second substrate Sb is subjected to a back grinding process so as to be a thin film whose substrate thickness is about 25 μm. Moreover, the first substrate Sa and the second substrate Sb in a wafer state are cut along scribe lines to be individual pieces.

By performing the above processes, a semiconductor device of the present embodiment is completed.

Note that, in the above-described processes, the surface treatment on the organic insulating film 501 is performed subsequent to the formation of the opening portion TH2 but prior to the formation of the second bump electrode 2BP. However, the surface treatment on the organic insulating film 501 may be performed subsequent to the formation of the second bump electrode 2BP but prior to the thermal compression-bonding between the substrates.

As described above, according to the present embodiment, the laminated insulating film TC of the inorganic insulating film 401 and the organic insulating film 501 is formed on the rear surface of the first substrate Sa, and therefore, the degassing from the organic insulating film 501 can be reduced in the heating and compression-bonding processes for the first substrate Sa and the second substrate Sb. Therefore, the occurrence of voids at the time of the compression-bonding process can be suppressed, and the peeling between the substrates due to bonding failure between the substrates can be reduced. Moreover, the connection failure between the bump electrodes can be reduced. In this manner, the characteristics of the semiconductor device can be improved.

According to the present embodiment, the surface treatment is performed on the surface of the organic insulating film 501 prior to the thermal compression-bonding between the substrates, and therefore, the adhesive property of the organic insulating film 501 can be improved.

Seventh Embodiment

Figure 48:
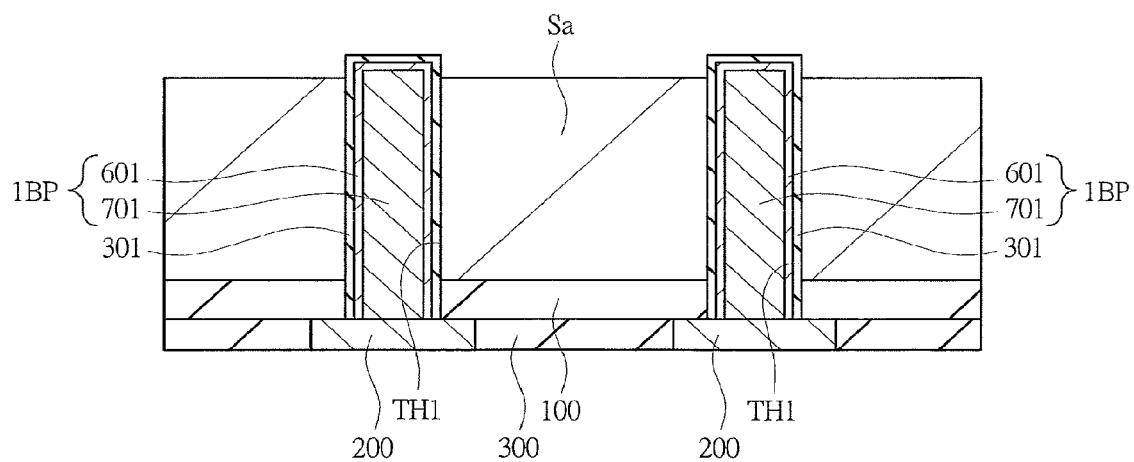
FIG. 48 is a cross-sectional view illustrating a manufacturing step of a semiconductor device of a seventh embodiment.
Figure 49:
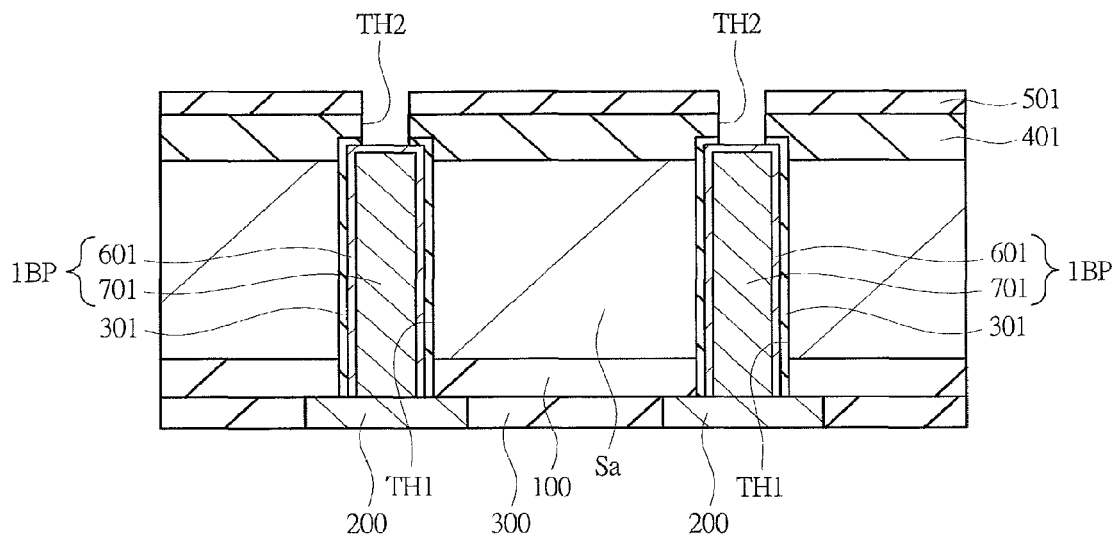
FIG. 49 is a cross-sectional view illustrating the manufacturing step of the semiconductor device of the seventh embodiment, which is a cross-sectional view in the manufacturing step of the semiconductor device continued from FIG. 48.
Figure 50:
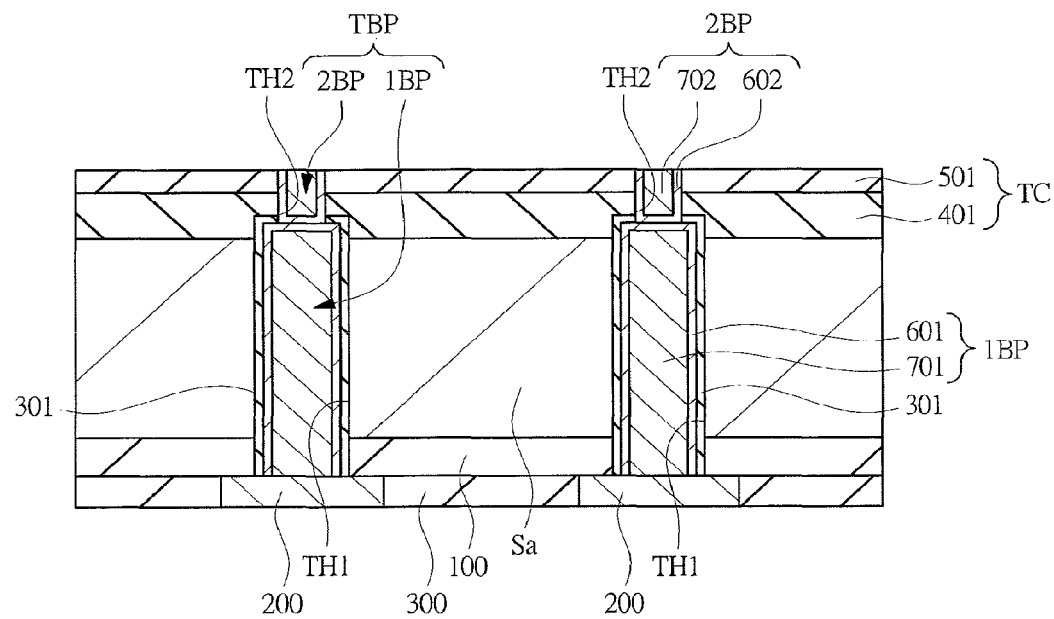
FIG. 50 is a cross-sectional view illustrating the manufacturing step of the semiconductor device of the seventh embodiment, which is a cross-sectional view in the manufacturing step of the semiconductor device continued from FIG. 49.

In the sixth embodiment, the back grinding process is performed on the first substrate Sa until the first bump electrode 1BP or the insulating film 301 is exposed (FIG. 45). However, an over grinding process may be further performed thereon so that the first bump electrode 1BP protrudes from the surface of the first substrate Sa. FIGS. 48 to 50 are cross-sectional views illustrating the manufacturing steps of the semiconductor device of the seventh embodiment.

[Explanation of Structure]

In FIG. 50 that is one of the cross-sectional views illustrating the manufacturing steps of the semiconductor device of the present embodiment, the rear surface of the first substrate Sa (second surface, surface on the side opposite to the formation side of the semiconductor element) is illustrated as the upper side. Therefore, the formation layer 100 for the semiconductor element (which is the inner layer of the semiconductor element) formed on the front surface of the first substrate Sa (which is the first surface, element surface, surface on the formation side of the bump electrode, surface on the formation side of the semiconductor element) is positioned on the lower side of the first substrate Sa. Further below the formation layer 100 for the semiconductor element, the pad electrode (conductive film) 200 is arranged.

Moreover, on the rear surface of the first substrate Sa, a laminated insulating film TC of an inorganic insulating film 401 and an organic insulating film 501 is arranged. An opening portion TH2 is formed in the laminated insulating film TC, and a second bump electrode 2BP is arranged inside the opening portion TH2. Moreover, in the first substrate Sa and the formation layer 100 for the semiconductor element, an opening portion TH1 that reaches the pad electrode 200 is formed. Inside the opening portion TH1, a first bump electrode 1BP is arranged. The surface of the first bump electrode 1BP protrudes from the rear surface of the first substrate Sa (which is an upper surface in FIG. 50). A bump electrode TBP is formed by a laminate of the first bump electrode 1BP and second bump electrode 2BP.

Also in the present embodiment, the opening portion TH2, which is opened by dry-etching the laminated insulating film TC of the inorganic insulating film 401 and the organic insulating film 501 or others, is arranged on the upper portion of the pad electrode 200 (FIG. 50). Moreover, a surface treatment is performed on the organic insulating film 501.

[Explanation of Manufacturing Method]

The manufacturing steps of the semiconductor device of the present embodiment are explained, and besides, the structure of the semiconductor device of the present embodiment is further clarified.

As similar to the fifth embodiment, on the first substrate Sa, the opening portion (concave portion) TH1, the insulating film 301 and the first bump electrode 1BP are formed, and the uppermost layer wire (pad electrode 200) is further formed thereon (see FIG. 39).

Then, as illustrated in FIG. 48, a back grinding process is performed so that the thickness of the first substrate Sa is a predetermined thickness (for example, about 25 µm) when the rear surface of the first substrate Sa is set as the upper side. Here, the first substrate Sa is subjected to the back grinding process until the insulating film 301 on the first bump electrode 1BP is exposed, and is further subjected to the over grinding process. In particular, in the grinding (polishing) step, by performing the grinding process under such a condition that a chemically-polished component is superior, the first substrate Sa can be recessed relative to the first bump electrode 1BP (insulating film 301). Note that the insulating film 301 may be removed by the back grinding process so that the first bump electrode 1BP is exposed.

Next, as illustrated in FIG. 49, for example, a silicon oxide film is deposited on the first substrate Sa as an inorganic insulating film 401 by the CVD method or others. Next, an organic insulating film 501 is formed on the inorganic insulating film 401. Here, as the organic insulating film 501, a PBO film is formed as similar to the first embodiment.

Next, by performing exposure and development steps, the organic insulating film 501 in the formation region of the opening portion TH2 is removed. Then, the inorganic insulating film 401 and the insulating film 301 are etched with using the organic insulating film 501 as a mask. Thus, the opening portion TH2, which reaches the first bump electrode 1BP, is formed.

Next, a surface treatment is performed on the surface of the organic insulating film 501 (which is the rear surface of the first substrate Sa). As the surface treatment, for example, gas containing hydrogen radicals is sprayed onto the surface of the organic insulating film 501. Thus, the surface of the organic insulating film 501 is modified.

Next, as illustrated in FIG. 50, as a barrier metal film 602, for example, a TiN film is deposited on the organic insulating film 501 including the inside of the opening portion TH2 by using the sputtering method or others. Then, a Cu film is deposited on the barrier metal film 602 as a seed film (not illustrated) by the sputtering method. Next, a Cu film 702 is deposited on the upper portion of the seed film by the electrolytic plating method.

Next, the Cu film 702, the seed film and the barrier metal film 602 on the organic insulating film 501 are polished by using the CMP method. Thus, a second bump electrode 2BP formed of the Cu film 702, the seed film and the barrier metal film 602 is formed inside the opening portion TH2.

By the above-described steps, the bump electrode TBP is formed so as to be connected to the pad electrode 200, to be formed of a laminated structure of the first bump electrode 1BP and the second bump electrode 2BP, and to be exposed from the rear surface of the first substrate Sa (second surface, surface on the side opposite to the formation side of the semiconductor element).

Next, for example, the second substrate Sb as explained in a second embodiment is prepared, and the front surface of the second substrate Sb (which is the first surface, element surface, surface on the formation side of the bump electrode, surface on the formation side of the semiconductor element) and the rear surface of the first substrate Sa (which is the second surface, surface on the side opposite to the formation side of the semiconductor element) are faced and overlapped with each other as similar to the fifth embodiment, and then, these substrates are thermally compressed and bonded (see FIG. 44). At this time, electrical connection between the bump electrodes (TBP, BPb) formed on the respective first substrate Sa and second substrate Sb and bonding between the organic insulating films (501, 500b) are simultaneously performed.

Then, the rear surface of the second substrate Sb is subjected to a back grinding process so as to be a thin film whose substrate thickness is about 25 µm. Moreover, the first substrate Sa and the second substrate Sb in a wafer state are cut along scribe lines to be individual pieces.

By performing the above steps, a semiconductor device of the present embodiment is completed.

Note that, in the above-described steps, the surface treatment on the organic insulating film 501 is performed subsequent to the formation of the opening portion TH2 but prior to the formation of the second bump electrode 2BP. However, the surface treatment on the organic insulating film 501 may be performed subsequent to the formation of the second bump electrode 2BP prior to the thermal compression-bonding between the substrates.

As described above, according to the present embodiment, the laminated insulating film TC of the inorganic insulating film 401 and the organic insulating film 501 is formed on the rear surface of the first substrate Sa, and therefore, the degassing from the organic insulating film 501 can be reduced in the heating and compression-bonding processes for the first substrate Sa and the second substrate Sb. Therefore, the occurrence of voids at the time of the compression-bonding process can be suppressed, and the peeling between the substrates due to bonding failure between the substrates can be reduced. Moreover, the connection failure between the bump electrodes can be reduced. In this manner, the characteristics of the semiconductor device can be improved.

According to the present embodiment, the surface treatment is performed on the surface of the organic insulating film 501 prior to the thermal compression-bonding between the substrates, and therefore, the adhesive property of the organic insulating film 501 can be improved.

Also in the above-described second to seventh embodiments, the same peeling test as that of the first embodiment has been performed, and it has been confirmed that the adhesive force between the substrates is improved in the structure of each embodiment.

Moreover, in the above-described third to seventh embodiments, the thermal compression-bonding process has been performed so as to bond the bump electrodes (BP, BPb) on the front surface of the second substrate Sb and the rear surface of the first substrate Sa to each other. However, substrates each having the same structure as that of the first substrate Sa may be prepared, and the rear surfaces of these substrates may be thermally compressed and bonded to each other. Moreover, as the second substrate Sb, the second substrate Sb of the second embodiment has been exemplified. However, instead of this, the second substrate Sb of the first embodiment may be used.

In this manner, the substrates (Sa, Sb) described in the first to seventh embodiments may be combined with each other, and the thermal compression-bonding process may be performed so as to bond the bump electrodes to each other. Moreover, when the organic insulating films are bonded to each other as well as the bump electrodes are bonded to each other, the constituent metal of the other bump electrode may be made different, and besides, the other organic insulating film may be prepared as another insulating film (for example, inorganic insulating film).

Moreover, also in the second to seventh embodiments, the thermal compression-bonding may be performed after the first substrate Sa and the second substrate Sb in a wafer state are formed into individual pieces.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention relates to a semiconductor device and a method of manufacturing the semiconductor. More particularly, the present invention is effectively applied to a semiconductor device (three-dimensional IC) in which a plurality of semiconductor substrates are electrically connected to each other via an electrode.

What is claimed is:

1. A method of manufacturing a semiconductor device, comprising:
    on a first substrate:
        (a1) forming a first insulating film made of an inorganic film on a surface of the first substrate,
        (b1) forming a second insulating film made of an organic film on the first insulating film,
        (c1) forming a first opening portion by dry-etching the first insulating film and the second insulating film, and
        (d1) forming a first electrode by burying a first conductive film inside the first opening portion;
    on a second substrate:
        (a2) forming a third insulating film made of an inorganic film on a surface of the second substrate,
        (b2) forming a fourth insulating film made of an organic film on the third insulating film,
        (c2) forming a second opening portion by dry-etching the third insulating film and the fourth insulating film, and
        (d2) forming a second electrode by burying a second conductive film inside the second opening portion; and
    (e) bonding the surface of the first substrate and the surface of the second substrate to each other,
    wherein a hydrogen radical treatment is performed on the second insulating film after the step (c1) and before the step (e), and
    wherein a hydrogen radical treatment is performed on the fourth insulating film after the step (c2) and before the step (e).

2. The method of manufacturing the semiconductor device according to claim 1, wherein the second insulating film contains polybenzoxazole, polyimide, or benzocyclobutene.

3. The method of manufacturing the semiconductor device according to claim 1, wherein the dry-etching is performed under plasma atmosphere.

4. The method of manufacturing the semiconductor device according to claim 1, wherein the second insulating film contains polybenzoxazole, and a carbon-ion amount of a surface portion of the second insulating film is reduced by the hydrogen radical treatment.

5. The method of manufacturing the semiconductor device according to claim 1, wherein the step (e) includes thermally compressing and bonding the second insulating film and the fourth insulating film to each other so that the first electrode and the second electrode are connected to each other.

6. The method of manufacturing the semiconductor device according to claim 5, wherein the first substrate and the second substrate are in a wafer state, and the method further includes, after the step (e):
    (f) forming the first substrate or the second substrate as a thin film; and
    (g) after the step (f), cutting the first substrate and the second substrate.

* * * * *